United States Patent
Tsai et al.

(10) Patent No.: US 12,287,424 B2
(45) Date of Patent: Apr. 29, 2025

(54) RADAR SENSING SYSTEM AND METHOD THEREOF

(71) Applicant: CUBTEK INC., Hsinchu County (TW)

(72) Inventors: Ching Han Tsai, Hsinchu County (TW); Hsiao-Ning Wang, Hsinchu County (TW); Chung-Chin Jian, Hsinchu County (TW)

(73) Assignee: CUBTEK INC., Hsinchu County (TW)

( * ) Notice: Subject to any disclaimer, the term of this patent is extended or adjusted under 35 U.S.C. 154(b) by 238 days.

(21) Appl. No.: 17/664,049

(22) Filed: May 19, 2022

(65) Prior Publication Data

US 2022/0381879 A1    Dec. 1, 2022

Related U.S. Application Data

(60) Provisional application No. 63/193,075, filed on May 26, 2021.

(30) Foreign Application Priority Data

Mar. 4, 2022   (TW) .................................. 111107935

(51) Int. Cl.
   *G01S 7/40*      (2006.01)
   *G01S 7/02*      (2006.01)
   *G01S 13/931*    (2020.01)

(52) U.S. Cl.
   CPC ............... *G01S 7/40* (2013.01); *G01S 7/027* (2021.05); *G01S 13/931* (2013.01)

(58) Field of Classification Search
   CPC .......... G01S 7/40; G01S 7/027; G01S 13/931; G01S 7/032; G01S 13/42; G01S 7/2813; H05K 1/148; H05K 1/165; H01Q 1/42
   See application file for complete search history.

(56) References Cited

U.S. PATENT DOCUMENTS

| | | | | |
|---|---|---|---|---|
| 5,392,053 A | * | 2/1995 | Hirata | H01Q 1/42 |
| | | | | 343/705 |
| 10,935,656 B2 | * | 3/2021 | Yu | G01S 7/027 |
| 11,187,788 B2 | * | 11/2021 | Lee | G01S 13/931 |
| 2019/0310346 A1 | * | 10/2019 | Lee | G01S 13/931 |
| 2019/0353751 A1 | * | 11/2019 | Raphaeli | G01S 13/931 |
| 2020/0081110 A1 | * | 3/2020 | Nam | G01S 13/931 |
| 2021/0063557 A1 | * | 3/2021 | Yu | G01S 7/027 |

FOREIGN PATENT DOCUMENTS

| | | |
|---|---|---|
| KR | 20190117933 A | 10/2019 |
| TW | I680898 B | 1/2020 |
| TW | 202111348 A | 3/2021 |

* cited by examiner

*Primary Examiner* — Bernarr E Gregory
(74) *Attorney, Agent, or Firm* — CKC & Partners Co., LLC

(57) ABSTRACT

A radar sensing system is for being disposed on a vehicle. The radar sensing system includes a sensing unit and a housing. The sensing unit includes a receiving antenna array, which includes at least four receiving antennas. The receiving antennas are arranged on an antenna plane and have a receiving antenna center. A distance between the receiving antenna center and a ground plane is greater than 40 cm. The receiving antennas are arranged asymmetrically with respect to the receiving antenna center. The housing includes a bottom surface, which is attached on an outer surface of the vehicle. The sensing unit is disposed in the housing. An antenna plane angle between the antenna plane and the outer surface of the vehicle is in a range of 0 degrees to 90 degrees.

14 Claims, 16 Drawing Sheets

RADAR SENSING SYSTEM AND METHOD THEREOF

RELATED APPLICATIONS

This application claims priority to U.S. Provisional Application Ser. No. 63/193,075, filed on May 26, 2021, and Taiwan Application Serial Number 111107935, filed on Mar. 4, 2022, which are herein incorporated by reference.

TECHNICAL FIELD

The present disclosure relates to a radar sensing system and a method thereof. More particularly, the present disclosure relates to a radar sensing system and a method thereof applied to a vehicle.

DESCRIPTION OF RELATED ART

With the rapid developments of advanced driver assistance system (ADAS) and autopilot technology, the radar system installed in the vehicle is used to sense the position of the target or object relative to the vehicle to achieve the functions of BSD (Blind Spot Detection), LCA (Lane Change Assistance), LDW (Lane Departure Warning), RCTA (Rear Cross Traffic Alert) and FCW (Front Collision Warning), and to prevent accidents caused by radius difference between inner wheels. However, for the conventional radar systems, the sensing correctness and accuracy of the target position is affected by echoes or multipath signals.

In an ideal or general situation, the radar of the vehicle detects a target (i.e., a target object) by transmitting a signal in form of an electromagnetic wave to the target, then the signal reflected from the target returns along the original transmitting path to the radar to receive, and the radar determines the information of the target, such as a distance, a speed and an angle, according to the receiving signal. In this case, the transmitting angle and the receiving angle are the same.

FIG. 4 is a schematic view of the conventional radar system 400 in a usage state. With reference to FIG. 4, however, in some other cases, also assuming a target (such as the actual target t1 in FIG. 4), the conventional radar system 400 of the vehicle may receive signals other than the signal returned from the original transmitting path of the actual target t1. These other signals come from the electromagnetic waves reflected from the actual target t1 and then reflected from other reflecting surfaces, and are received by the conventional radar system 400 almost simultaneously, and it is the so-called multipath problem.

The lengths of the paths passed by these signals reflected from other reflecting surfaces (e.g., the sub-path s21 plus the sub-path s22, and the length thereof is the same as the length of the sub-path s21 plus the virtual sub-path s22m) will be longer than the length of the original transmitting path (i.e., the actual transmitting path s1). The speeds of these signals reflected from other reflecting surfaces are quite close to the speed of the return signal from the original transmitting path. Due to the limited accuracy of the distance and speed detected by the conventional radar system 400, these multipath signals fall in the same range-Doppler bin of the conventional radar system 400 and cannot be distinguished. In this case, the conventional radar system 400 does not only sense the actual target t1 with the same angle as the original transmitting angle, but also senses the virtual mirror target t2 (i.e., ghost image) with different angles, as shown in FIG. 4. Since the path lengths passed by the mirror target t2 and the actual target t1 are different, the respective phases received by the antenna will also be different. However, the existence of the mirror target t2 will destroy the phase distribution of the antenna for the actual target t1, which makes the conventional radar system 400 distort the angle judgment of the actual target t1. For example, the mirror target t2 may be formed relative to the actual target t1 by a reflecting surface such as a partition island (or a guardrail) 490 or a vehicle body surface, but is not limited thereto.

Therefore, there is an urgent need to develop an integrated solution that effectively reduces sensing errors caused by mirror targets in today's market related to the radar systems.

SUMMARY

According to one aspect of the present disclosure, a radar sensing system is for being disposed on a vehicle. The radar sensing system includes a sensing unit and a housing. The sensing unit includes a receiving antenna array, which includes at least four receiving antennas. The receiving antennas are arranged on an antenna plane and have a receiving antenna center. A distance between the receiving antenna center and a ground plane is greater than 40 cm. The receiving antennas are arranged asymmetrically with respect to the receiving antenna center. There is a receiving antenna spacing between each adjacent two of the receiving antennas, and the receiving antenna spacings have ratios of 1:3:2 in order. The housing includes a bottom surface, which is attached on an outer surface of the vehicle. The sensing unit is disposed in the housing. An antenna plane angle between the antenna plane and the outer surface of the vehicle is in a range of 0 degrees to 90 degrees. A vertical distance between the receiving antenna center and the bottom surface is smaller than or equal to 2 cm. The sensing unit is for sensing an actual target, and a distance along a longitudinal direction of the vehicle between the receiving antenna center and the actual target is greater than 30 m and smaller than 100 m.

According to another aspect of the present disclosure, a radar sensing system is for being disposed on a vehicle. The radar sensing system includes a sensing unit, a housing and at least one blocking unit. The sensing unit includes a receiving antenna array, which includes at least three receiving antennas. The receiving antennas are arranged on an antenna plane and have a receiving antenna center. The receiving antennas are arranged symmetrically with respect to the receiving antenna center. There is a receiving antenna spacing between each adjacent two of the receiving antennas, and the receiving antenna spacings are equal. The housing includes a bottom surface, which is attached on an outer surface of the vehicle. The sensing unit is disposed in the housing. An antenna plane angle between the antenna plane and the outer surface of the vehicle is in a range of 0 degrees to 90 degrees. A vertical distance between the receiving antenna center and the bottom surface is smaller than or equal to 2 cm. The blocking unit is disposed on the outer surface of the vehicle for blocking a reflected signal of a mirror target, which is virtual. An average surface roughness of the blocking unit is smaller than 5 cm. The sensing unit is for sensing an actual target, and a distance along a lateral direction of the vehicle between the receiving antenna center and the actual target is in a range of 1 m to 5 m.

According to further another aspect of the present disclosure, a radar sensing method is applied to a radar sensing system of a vehicle. The radar sensing system includes a sensing unit. The sensing unit is disposed on an outer surface of the vehicle and includes a receiving antenna array, which includes a plurality of receiving antennas. The receiving antennas are arranged on an antenna plane. An antenna plane angle between the antenna plane and the outer surface of the vehicle is in a range of 0 degrees to 90 degrees. The radar sensing method includes a steering matrix establishing step, a sensing step, a normalizing step and a target angle table generating step. The steering matrix establishing step includes establishing a steering matrix according to a plurality of first path group coefficients, a plurality of second path group coefficients, a plurality of third path group coefficients, a plurality of fourth path group coefficients and a plurality of steering vectors respectively corresponding thereto of the receiving antennas, and defining a receiving signal received by the receiving antennas as a function of the steering matrix. For one of the receiving antennas, an actual target path is a straight-line path between the receiving antenna and an actual target, and a mirror target path is a straight-line path between the receiving antenna and a mirror target, which is virtual. The sensing step includes causing the receiving antennas to receive the receiving signal. The normalizing step includes normalizing the steering matrix with a component thereof corresponding to a reference antenna to obtain a normalized steering matrix, normalizing the receiving signal with a component thereof corresponding to the reference antenna to obtain a normalized receiving signal, and defining that the normalized steering matrix and the normalized receiving signal are equal. The reference antenna is one of the receiving antennas. The target angle table generating step includes generating a target angle table according to the normalized steering matrix. The target angle table includes the steering matrix and an actual target angle corresponding thereto or a mirror target angle corresponding thereto. The actual target angle is an angle between a normal direction of the antenna plane and the actual target path, and the mirror target angle is an angle between the normal direction of the antenna plane and the mirror target path.

BRIEF DESCRIPTION OF THE DRAWINGS

The present disclosure can be more fully understood by reading the following detailed description of the embodiment, with reference made to the accompanying drawings as follows.

DETAILED DESCRIPTION

The present disclosure will now be described more specifically with reference to the following embodiments. It is to be noted that the following descriptions of preferred embodiments of this disclosure are presented herein for the purposes of illustration and description only; it is not intended to be exhaustive or to be limited to the precise form disclosed.

It will be understood that when an element (or mechanism or module) is referred to as be "disposed on" or "connected to" another element, it can be directly disposed on or connected to the other element, or it can be indirectly disposed on or connected to the other element, that is, intervening elements may be present. In contrast, when an element is referred to as be "directly disposed on" or "directly connected to" another element, there are no intervening elements present. In addition, the terms first, second, third, etc. are used herein to describe various elements or components, these elements or components should not be limited by these terms. Consequently, a first element or component discussed below could be termed a second element or component.

Figure 1A:
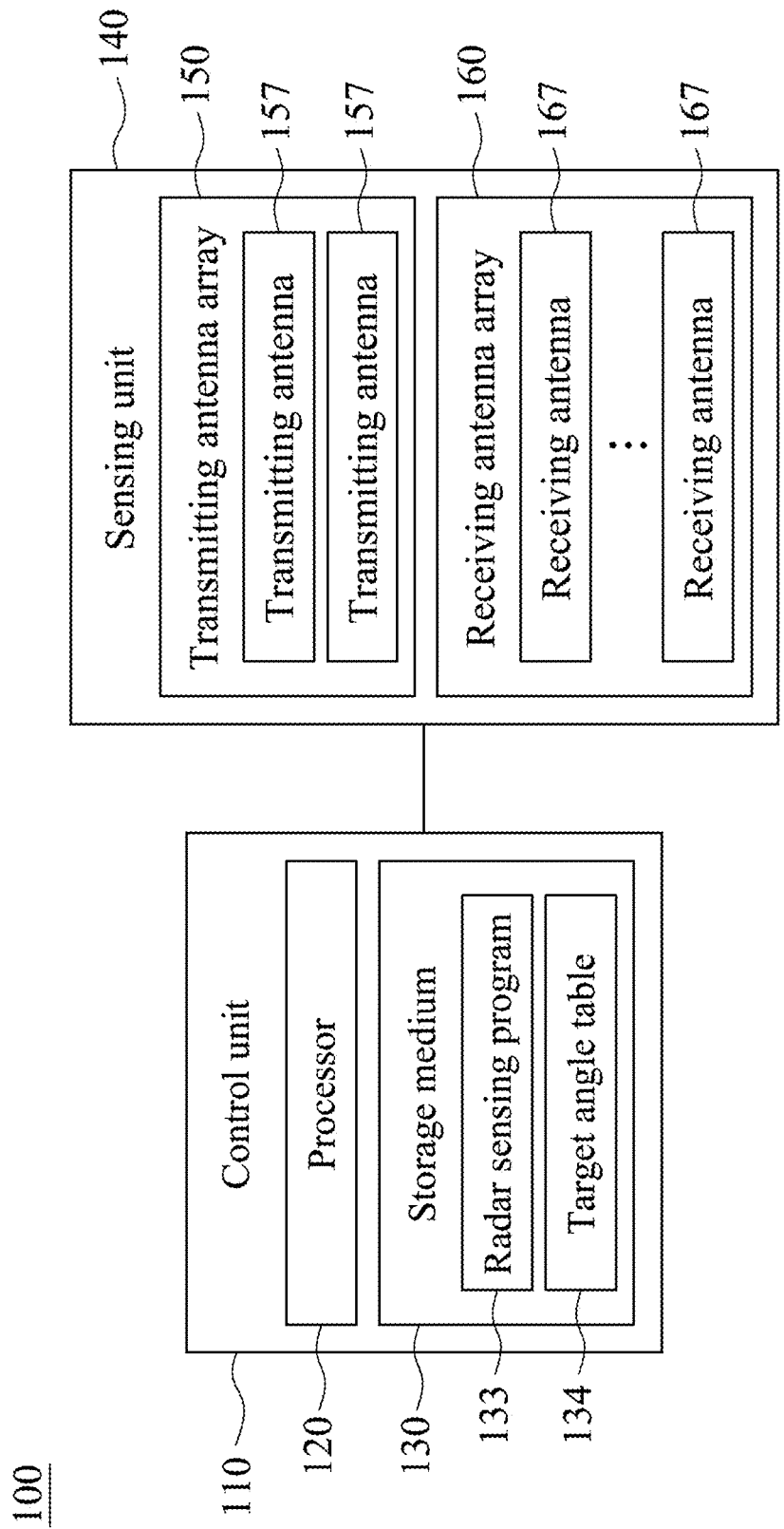
FIG. 1A is a block diagram of a radar sensing system according to the 1st embodiment of the present disclosure.
Figure 1B:
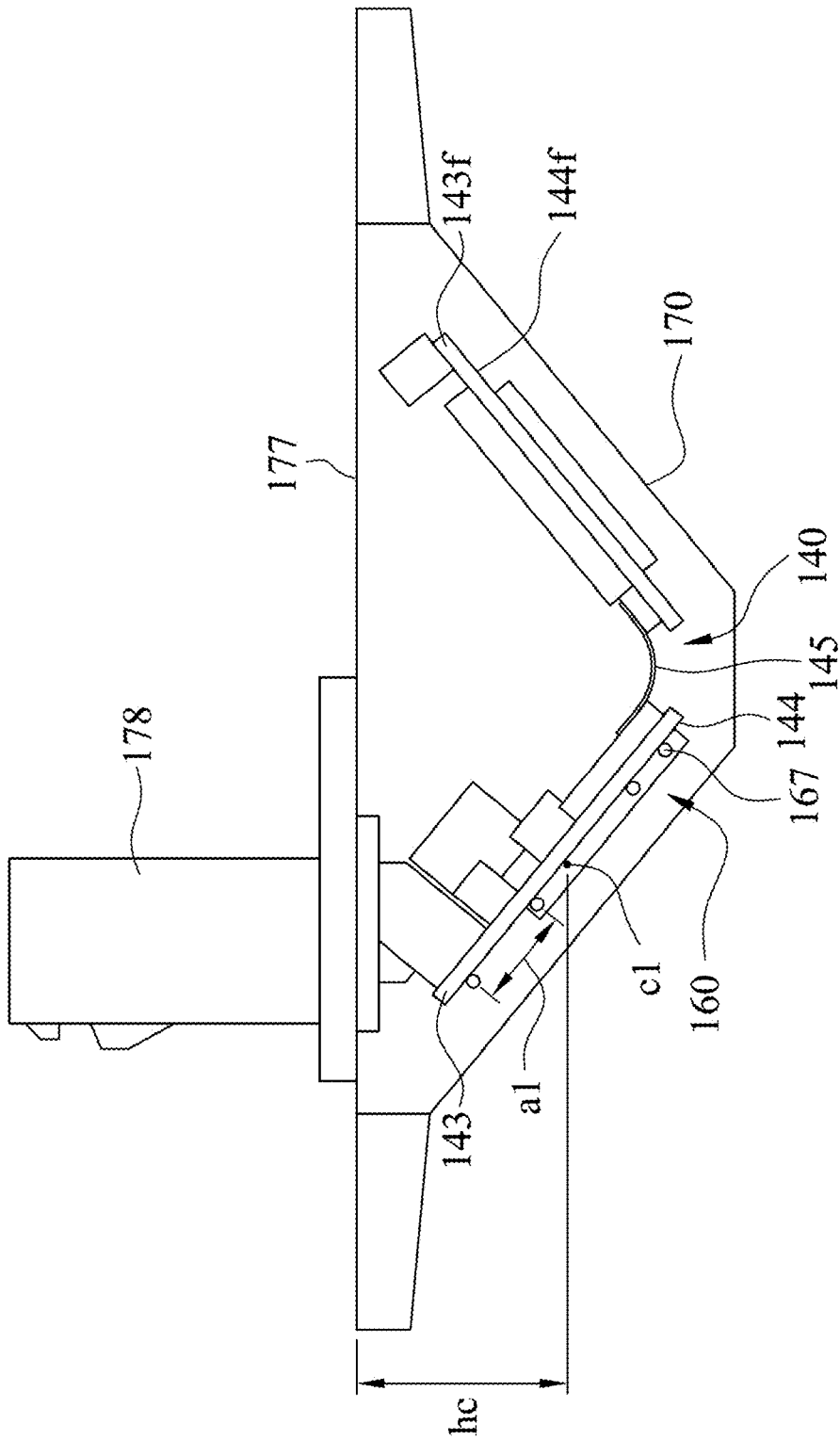
FIG. 1B is a schematic view of the radar sensing system according to the 1st embodiment.
Figure 1C:
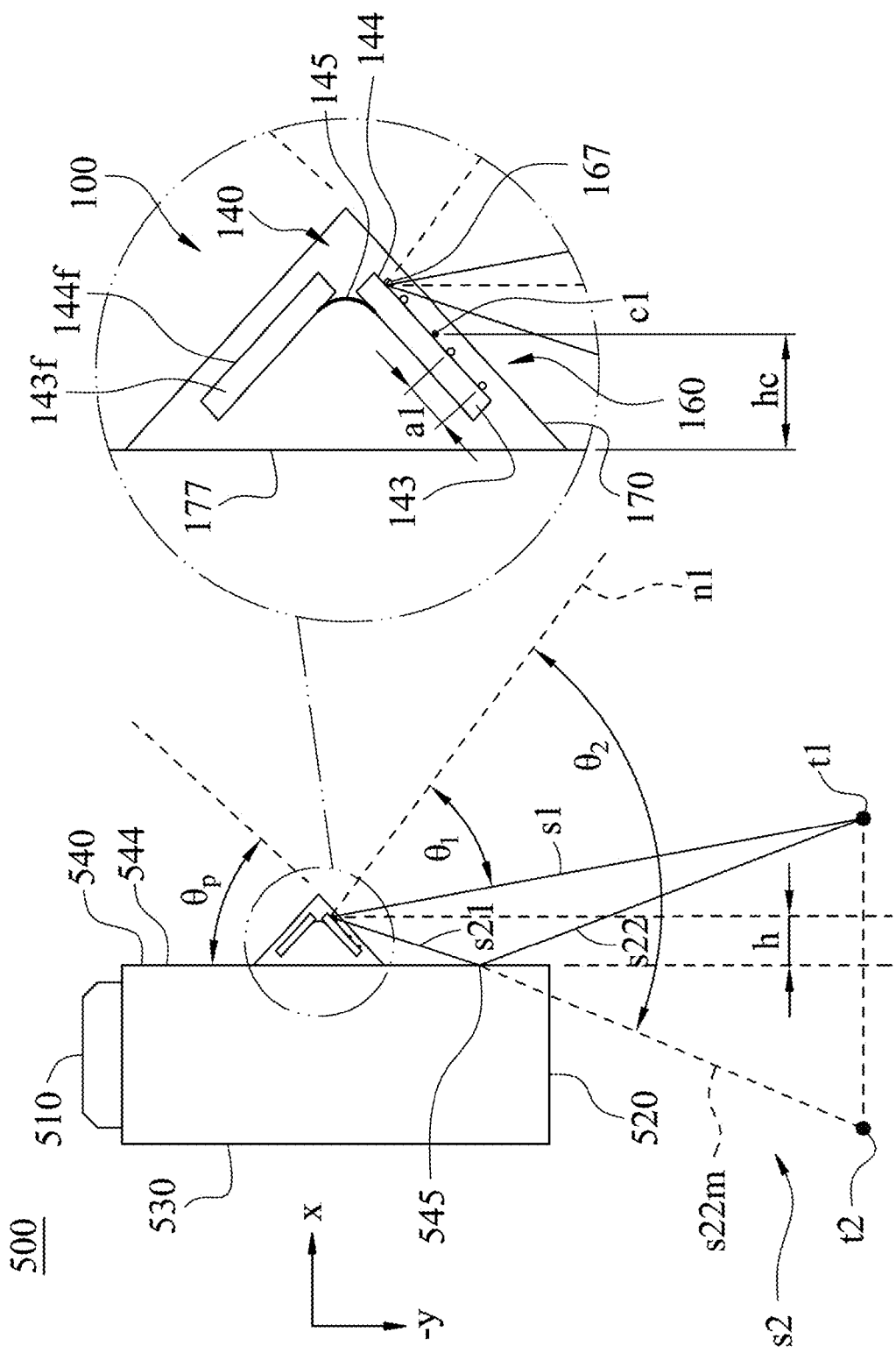
FIG. 1C is a schematic view of the radar sensing system according to the 1st embodiment in a usage state.

FIG. 1A is a block diagram of a radar sensing system 100 according to the 1st embodiment of the present disclosure, FIG. 1B is a schematic view of the radar sensing system 100 according to the 1st embodiment, and FIG. 1C is a schematic view of the radar sensing system 100 according to the 1st embodiment in a usage state (not shown in an actual scale). With reference to FIG. 1A to FIG. 1C, the radar sensing system (i.e., a radar system, a radar sensing system) 100 is for being disposed on a vehicle 500. The radar sensing system 100 includes a sensing unit 140, a control unit 110 and a housing 170. The sensing unit 140 includes a receiving antenna array 160, which includes a plurality of receiving antennas 167. The receiving antennas 167 are arranged on an antenna plane 144 and have a receiving antenna center c1, which is a geometric center of the receiving antennas 167. A distance between the receiving antenna center c1 and a ground plane is greater than 40 cm. Further, the vehicle 500 may be a single vehicle or a tractor connecting to a trailer. The sensing unit 140 and the control unit 110 may be integrated into one device disposed in the housing 170, or two separated devices, e.g., the control unit 110 is a part of a control system of the vehicle 500. An outer surface 544 of the vehicle 500 may be made of at least one material, which is easy or not easy to reflect signals, e.g., metal, plastic, etc.

With reference to FIG. 1B and FIG. 1C, the housing 170 includes a bottom surface 177, which is directly attached on the outer surface 544 of the vehicle 500 (e.g., the housing 170 is fixed on the outer surface 544 of the vehicle 500 via an power connector 178 thereof). That is, a vertical distance (i.e., a spacing, a gap) between the bottom surface 177 and the outer surface 544 is substantially zero. The sensing unit 140 is disposed in the housing 170. An antenna plane angle $\theta_p$ between the antenna plane 144 and the outer surface 544 of the vehicle 500 is in a range of 0 degrees to 90 degrees (including 0 degrees and 90 degrees, the following contents with recitations "in a/the range of" applying thereto). A vertical distance hc between the receiving antenna center c1 and the bottom surface 177 is smaller than or equal to 2 cm. The sensing unit 140 is for sensing an actual target t1, and a distance along a longitudinal direction y (i.e., in a longitudinal direction y) of the vehicle 500 between the receiving antenna center c1 and the actual target t1 may be greater than 30 m and smaller than 100 m. It means that the distance along the longitudinal direction y of the vehicle 500 between the receiving antenna center c1 and the actual target t1 may also be smaller than 30 m.

With reference to FIG. 1A, the control unit 110 is communicatively (electrically) coupled to the receiving antennas 167. The control unit 110 includes a processor 120 and a storage medium 130. The storage medium 130 is communicatively coupled to the processor 120 and may be configured to provide a radar sensing program 133 and a target angle table 134. The target angle table 134 includes actual target angles $\theta 1$ or mirror target angles $\theta 2$, or angles having corresponding relationships with the aforementioned two angles.

The storage medium 130 is specifically a non-transitory computer-readable storage medium, and the radar sensing program 133 is specifically program codes. The control unit 110, according to the radar sensing program 133 and the target angle table 134, is for reducing a sensing error resulted from a mirror target (i.e., a mirror image target object) t2, which is virtual. Therefore, a receiving signal of the receiving antennas 167 is synthesized from signals reflected from the actual target t1 and the mirror target t2. The target angle table 134 is advantageous in effectively excluding or reducing a proportion corresponding to the mirror target t2 in the receiving signal, so as to facilitate the radar sensing system 100 to more accurately sense the actual target t1.

In detail, the sensing unit 140 may further include a transmitting antenna array 150 (shown in FIG. 1A and omitted in FIG. 1B and FIG. 1C), which includes at least one transmitting antenna 157, and the transmitting antenna 157 is arranged on the antenna plane 144. Furthermore, the sensing unit 140 further includes radio frequency components and baseband components. Each antenna of the transmitting antenna 157 and receiving antennas 167 may be a circuit board antenna. The antenna plane 144 may be a side surface of a circuit board 143 which is away from the outer surface 544 of the vehicle 500, but not limited thereto. Specifically, with reference to FIG. 1B and FIG. 1C, the sensing unit 140 may further include an antenna plane 144$f$ configured with another transmitting antenna array and another receiving antenna array. The antenna plane 144$f$ is a side surface of a circuit board 143$f$ which is away from the outer surface 544 of the vehicle 500. An angle is formed between the circuit boards 143, 143$f$. The circuit boards 143, 143$f$ are rigid printed circuit boards to meet the reliability requirements when components are mounted on the side surfaces thereof. A circuit board 145 is physically and electrically connected between the circuit boards 143, 143$f$. The circuit board 145 may be a flexible printed circuit board (e.g., a flexible conductive multilayer film), and the circuit boards 143, 143$f$, 145 all meet the material requirements for high-frequency communication.

With reference to FIG. 1C, the outer surface 544 of the vehicle 500 may be located on a left portion 530 of the vehicle 500 or a right portion 540 thereof. The vertical distance between the bottom surface 177 of the housing 170 and the outer surface 544 may be substantially zero or not zero, and a vertical distance between the receiving antenna center c1 and the outer surface 544 is smaller than or equal 6.5 cm. Therefore, the radar sensing system 100 is advantageous in meeting the appearance requirements of the vehicle 500, improving the sensing accuracy for a left or right target while the vehicle 500 moving forward, backward and turning, and effectively preventing accidents caused by radius difference between inner wheels. Moreover, the vertical distance between the receiving antenna center c1 and the outer surface 544 may be greater than or equal 1.0 cm and smaller than or equal 6.5 cm.

A number of the receiving antennas 167 may be at least four. The receiving antennas 167 may be arranged symmetrically or asymmetrically with respect to the receiving antenna center c1. There is a receiving antenna spacing a1 between each adjacent two of the receiving antennas 167, and the receiving antenna spacings a1 may be equal or not be equal. Furthermore, there may be at least two different values of the receiving antenna spacings a1 among the receiving antennas 167. One of the receiving antenna spacings a1 may be an integer multiple (excluding 1 multiple) or a non-integral multiple of another of the receiving antenna spacings a1. For example, the receiving antennas 167 are arranged asymmetrically with respect to the receiving antenna center c1, and the receiving antenna spacings a1 have ratios of 1:3:2 in order. In the 1st embodiment, the receiving antennas 167 are arranged on a horizontal plane of the vehicle 500 in order, there are at least two different values of the receiving antenna spacings a1 among the receiving antennas 167, and the antenna plane angle $\theta_p$ is in a range of 30 degrees to 50 degrees. Therefore, the radar sensing system 100 is beneficial to accurately sense the actual target t1 located at the actual target angle $\theta 1$ between −30 degrees and 60 degrees or between −60 degrees and 30 degrees, and a range of the actual target angle $\theta 1$ of the sensing unit 140 disposed on the left portion 530 of the vehicle 500 or the right portion 540 thereof is substantially the same. Specifically, the sensing unit 140 is in a form of Multi-Input Multi-Output (MIMO) and includes two transmitting antennas 157 and four receiving antennas 167 (only four receiving antennas 167 shown in FIG. 1B and FIG. 1C). The four receiving antennas 167 are asymmetrical with respect to the receiving antenna center c1, and the receiving antenna spacings a1 of the four receiving antennas 167 along a direction from being away from the outer surface 544 to being adjacent to the outer surface 544 have ratios of 1:3:2 in order. Each of the receiving antenna spacings a1 may be an integer multiple of a half wavelength of a radar signal, which may be a millimeter wave, e.g., 77 GHz in frequency, but not limited thereto. Thus, there are three different values of the receiving antenna spacings a1 among the receiving antennas 167, but not limited thereto.

Figure 1D:
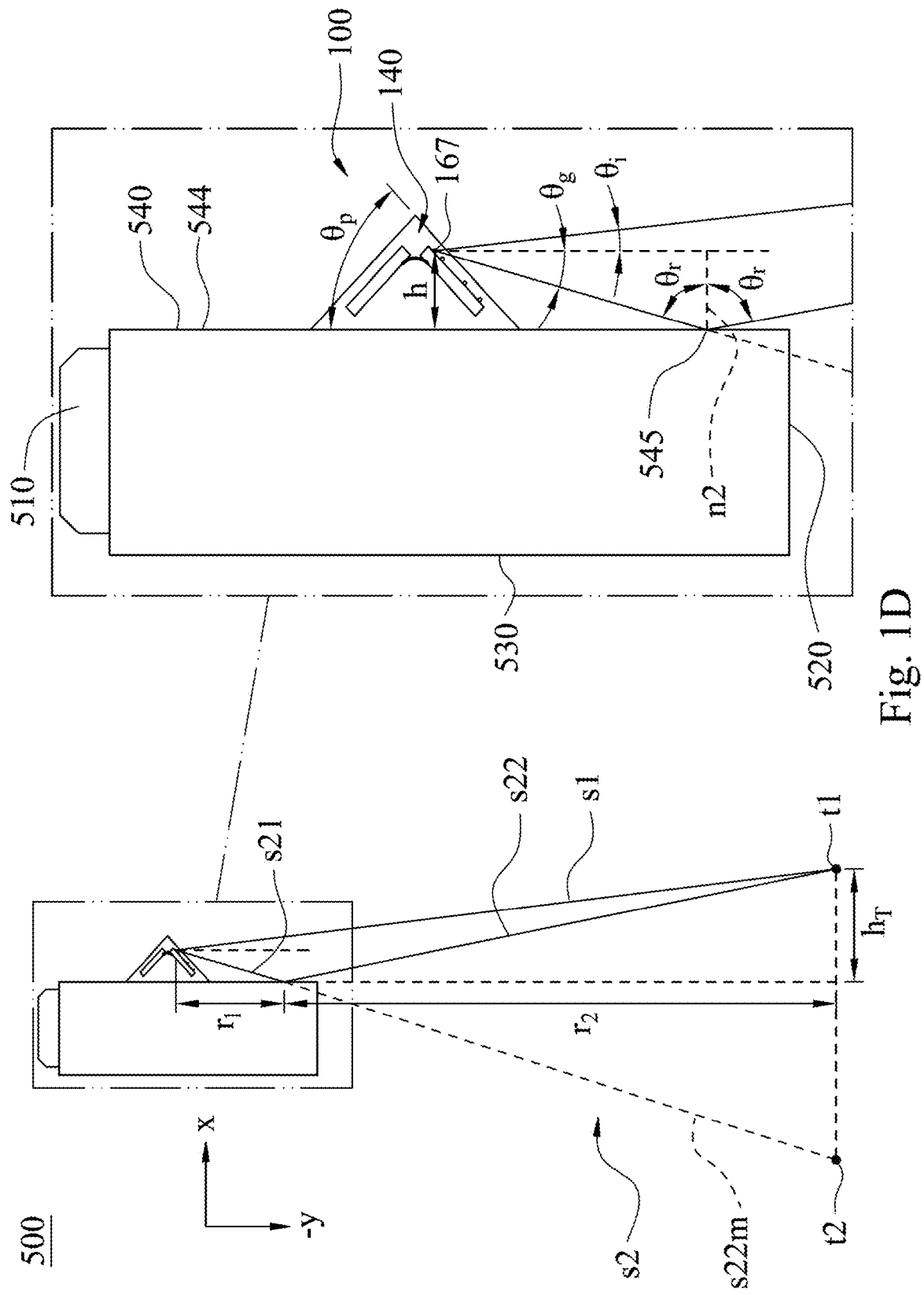
FIG. 1D is a schematic view of the radar sensing system according to the 1st embodiment in another usage state.

FIG. 1D is a schematic view of the radar sensing system 100 according to the 1st embodiment in another usage state (not shown in an actual scale). The geometric relationships among one of the receiving antennas 167, the actual target t1 and a reflection point 545 on the outer surface 544 of the vehicle 500 are shown in FIG. 1D and the following equations (1) to (5), wherein $r_1$ is a distance along the longitudinal direction y of the vehicle 500 between the receiving antenna 167 and the reflection point 545, the outer surface 544 of the vehicle 500 may be parallel to the longitudinal direction y, $r_2$ is a distance along the longitudinal direction y between the reflection point 545 and the actual target t1, R is a distance along the longitudinal direction y between the receiving antenna 167 and the actual target t1, $\theta_r$ is an angle between a sub-path s22 and a normal direction n2 of the reflection point 545 on the outer surface 544 (i.e., an incident angle and a reflection angle of a reflected signal at the reflection point 545), $\theta_g$ is an angle between a sub-path s21 and the longitudinal direction y and equals to 90-$\theta_r$ (degrees), $\theta_i$ is an angle between an actual target path s1 and the longitudinal direction y, h is a vertical distance between the receiving antenna 167 and the outer surface 544 of the vehicle 500 (i.e., a height along a lateral direction x of the vehicle 500), $h_T$ is a vertical distance between the actual target t1 and the outer surface 544 of the vehicle 500 (i.e., a height along the lateral direction x of the vehicle 500), and equations (1) to (5) are as follows:

$$r_1 + r_2 = R; \quad (1)$$

$$\tan(90 - \theta_r) = \tan(\theta_g) = \frac{h}{r_1} = \frac{h_T}{r_2}; \quad (2)$$

$$r_1 = \frac{h}{h_T} r_2; \quad (3)$$

$$r_2 = R / \left(1 + \frac{h}{h_T}\right); \text{ and} \quad (4)$$

$$\tan(\theta_i) = \frac{h_T - h}{R}. \quad (5)$$

Furthermore, the target angle table 134 may include a steering matrix and the actual target angle $\theta_1$ corresponding to the steering matrix or the mirror target angle $\theta_2$ corresponding thereto. For one of the receiving antennas 167, the actual target path s1 is a straight-line path between the receiving antenna 167 and the actual target (i.e., an actual target object) t1, the actual target angle $\theta_1$ is an angle between a normal direction n1 of the antenna plane 144 and the actual target path s1 (in FIG. 1C, the normal direction n1 is defined as zero degrees, a counterclockwise direction from the normal direction n1 is a positive angle, and the clockwise direction from the normal direction n1 is a negative angle), a mirror target path s2 is a straight-line path between the receiving antenna 167 and the mirror target t2, which is virtual, and the mirror target angle $\theta_2$ is an angle between the normal direction n1 of the antenna plane 144 and the mirror target path s2. The control unit 110 is further configured to calculate and obtain the steering matrix from the receiving signal, which is corresponding to the steering matrix, of the receiving antennas 167, and determine the actual target angle $\theta_1$ corresponding to the steering matrix or the mirror target angle $\theta_2$ corresponding thereto according to the target angle table 134. Therefore, the target angle table 134 provided in the storage medium 130 is advantages in calculating and looking up the table based on the receiving signal to obtain the sensing result, which excludes or reduces the influence of the mirror target t2. It should be noted that the radar sensing system 100 of the present disclosure considers multipath groups (such as the first to fourth path groups described in the 2nd embodiment below) to correct the sensing angle error. However, in the real or physical environment, only actual targets exist, and mirror targets do not exist. The signals traveling along an actual target path and a mirror target path are all reflected by the actual target to be received by receiving antennas, but the actual target path and the mirror target path are different. Thus, the conventional radar system tends to mistakenly determine that a received signal passing through the mirror target path is reflected from the mirror target, and mistakenly takes the mirror target as another actual target. That is, the conventional radar algorithm mistakenly regards the received signal as a signal reflected via another actual target path so as to result in the sensing error.

An angle relationship may be obtained according to a vertical distance h between one of the receiving antennas 167 and the outer surface 544 of the vehicle 500, an antenna plane angle $\theta_p$ and the actual target path s1, and the angle relationship is a relationship between the actual target angle $\theta_1$ and the mirror target angle $\theta_2$. Therefore, by reducing the calculation dimension, the accuracy of the radar sensing system 100 can be improved, and the calculation amount can be reduced at the same time.

Furthermore, the radar sensing system 100 according to the 1st embodiment can be applied to implement a radar sensing method 200 of the 2nd embodiment below. Thus, regarding other details of the radar sensing system 100, the contents of the radar sensing method 200 of the 2nd embodiment below can be referred, and the details are not described again herein.

Figure 2A:
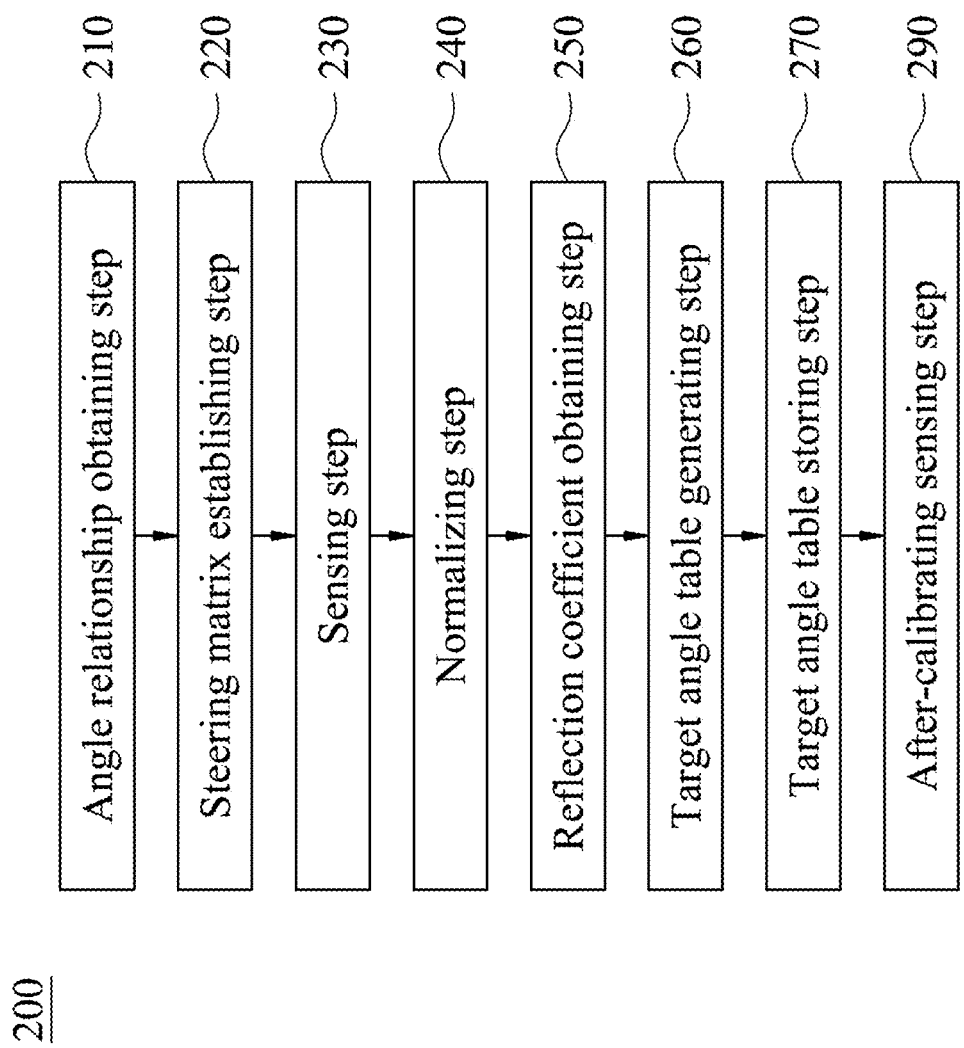
FIG. 2A is a flow chart of a radar sensing method according to the 2nd embodiment of the present disclosure.

FIG. 2A is a flow chart of the radar sensing method 200 according to the 2nd embodiment of the present disclosure, and the radar sensing method 200 according to the 2nd embodiment is described with an assistance of the radar sensing system 100 of the 1st embodiment of the present disclosure, which can be an executed example thereof. With reference to FIG. 1A, FIG. 1B and FIG. 2A, the radar sensing method 200 is applied to the radar sensing system 100 of the vehicle 500. The radar sensing system 100 includes the sensing unit 140. The sensing unit 140 is disposed on the outer surface 544 of the vehicle 500 and includes the receiving antenna array 160, which includes the plurality of receiving antennas 167. The receiving antennas 167 are arranged on the antenna plane 144. The antenna plane angle $\theta_p$ between the antenna plane 144 and the outer surface 544 of the vehicle 500 is in the range of 0 degrees to 90 degrees. The radar sensing method 200 includes a steering matrix establishing step 220, a sensing step 230, a normalizing step 240 and a target angle table generating step 260.

The steering matrix establishing step 220 includes establishing the steering matrix according to a plurality of first path group coefficients, a plurality of second path group coefficients, a plurality of third path group coefficients, a plurality of fourth path group coefficients and a plurality of steering vectors, which are respectively corresponding to the first to fourth path group coefficients, of the receiving antennas 167, and defining the receiving signal received by the receiving antennas 167 as a function of the steering matrix. For one of the receiving antennas 167, the actual target path s1 is the straight-line path between the receiving antenna 167 and the actual target t1, and the mirror target path s2 is the straight-line path between the receiving antennas 167 and the mirror target t2, which is virtual. The first path group coefficients are obtained according to the actual target path s1. Each of the second path group coefficients and the third path group coefficients are obtained according to the actual target path s1 and the mirror target path s2. The fourth path group coefficients are obtained according to the mirror target path s2. Moreover, the mirror target path s2 includes the sub-paths s21, s22, or the mirror target path s2 includes the sub-path s21 and a virtual sub-path s22m, and the sub-paths s22, s22m have the same length and are as mirror images to each other relative to the outer surface 544 of the vehicle 500.

The sensing step 230 includes causing the receiving antennas 167 to receive the receiving signal. The normalizing step 240 includes normalizing the steering matrix with a component thereof corresponding to a reference antenna to obtain a normalized steering matrix, normalizing the receiving signal with a component thereof corresponding to the reference antenna to obtain a normalized receiving signal, and defining that the normalized steering matrix and the normalized receiving signal are equal. The reference antenna is one of the receiving antennas 167.

The target angle table generating step 260 includes generating the target angle table 134 according to the normalized steering matrix. The target angle table 134 includes the steering matrix and the actual target angle θ1 corresponding to the steering matrix or the mirror target angle θ2 corresponding thereto. The actual target angle θ1 is the angle between the normal direction n1 of the antenna plane 144 and the actual target path s1, and the mirror target angle θ2 is the angle between the normal direction n1 of the antenna plane 144 and the mirror target path s2. Therefore, it is advantages in reducing the sensing error caused by the mirror target t2.

Moreover, by the radar sensing method 200, a multipath model or a multipath group model is established. That is, the receiving signal received by the receiving antennas 167 from the transmitting antenna 157 is established as the multipath model including a first path group, a second path group, a third path group and a fourth path group so as to further obtain the correct actual target angle $\theta_1$. The first path group is a path from the transmitting antenna 157 to the actual target t1 via the actual target path s1, and then a path to one of the receiving antennas 167 via the actual target path s1, and thereby the first path group coefficients are obtained according to the actual target path s1 or the actual target angle $\theta_1$. The second path group is a path from the transmitting antenna 157 to the actual target t1 via the actual target path s1, and then a path to one of the receiving antennas 167 via the mirror target path s2 (i.e., a path reflected from the reflection point 545 on the outer surface 544), and thereby the second path group coefficients are obtained according to the actual target path s1 or the actual target angle $\theta_1$, and the mirror target path s2 or the mirror target angle $\theta_2$. The third path group is a path from the transmitting antenna 157 to the actual target t1 via the mirror target path s2, and then a path to one of the receiving antennas 167 via the actual target path s1, and thereby the third path group coefficients are obtained according to the actual target path s1 or the actual target angle $\theta_1$, and the mirror target path s2 or the mirror target angle $\theta_2$. The fourth path group is a path from the transmitting antenna 157 to the actual target t1 via the mirror target path s2, and then a path to one of the receiving antennas 167 via the mirror target path s2, and thereby the fourth path group coefficients are obtained according to the mirror target path s2 or the mirror target angle $\theta_2$. The phase differences of the four path groups (i.e., the first to fourth path groups) are not only caused by the different lengths of the path groups, but also due to the reflection on the reflecting surface (the actual target t1 or the outer surface 544 and the reflection point 545 thereof), which causes the phase change. In addition, the energies (or powers, amplitudes) of the four path groups are different, which will also affect the synthesized phase. In the case of multipath, the receiving signal of the receive antennas 167 of the multipath model of the present disclosure are summed by signals of the four path groups.

In detail, the radar sensing method 200 may further includes an angle relationship obtaining step 210, which includes obtaining the angle relationship according to the vertical distance h between one (or each) of the receiving antennas 167 and the outer surface 544 of the vehicle 500, the antenna plane angle $\theta_p$ and the actual target path s1, and the angle relationship is the relationship between the actual target angle $\theta_1$ and the mirror target angle $\theta_2$. Therefore, by reducing the calculation dimension, the accuracy of the radar sensing method 200 can be improved, and the calculation amount can be reduced at the same time.

In the angle relationship obtaining step 210, when a vertical distance between one of the receiving antennas 167 and the outer surface 544 of the vehicle 500 is h, the antenna plane angle is $\theta_p$ degrees, the actual target path is s1, the actual target angle is θ1 degrees, and the mirror target angle is θ2 degrees, the following equation (6) may be satisfied:

$$\theta_2 = (90 - \theta_p) + \tan^{-1}\left(\frac{s1 \times \sin(90 - \theta_p - \theta_1) + 2 \times h}{s1 \times \cos(90 - \theta_p - \theta_1)}\right). \tag{6}$$

In the steering matrix establishing step 220, with reference to the following equations (7) to (11), X is the receiving signal of all the receiving antennas 167 and is represented by a matrix. The first four terms on the right side of the equal sign in equation (7) correspond to the signals of the first path group, the second path group, the third path group and the fourth path group, respectively. s(t) is a radar transmission signal form. $a(\theta_1)$ and $a(\theta_2)$ are the steering vectors and are functions of $\theta_1$ and $\theta_2$, respectively, and are related to the arrangement of the receiving antennas 167. Noise represents as noise or other signals. For example, when a number of the receiving antennas 167 is eight and the arrangement position is [0, 1, 4, 6, 9, 10, 13, 15]×0.5×λ, wherein A is the wavelength of the radar signal, the steering vector $a(\theta_1)$ and $a(\theta_2)$ can be represented by equation (8) correspondingly. Furthermore, in equations (7) and (9), $\alpha_1$ is the first path group coefficient, $\alpha_2$ is the second path group coefficient and the third path group coefficient, $\alpha_3$ is the fourth path group coefficient, and each of the coefficients $\alpha_1$, $\alpha_2$, $\alpha_3$ includes the phase change of the signal from the transmitting to the receiving process and the amplitude relationship between different path groups. s1 is the length of the actual target path, and s2 is the length of the mirror target path. Equations (7) to (11) are as follows:

$$X = a(\theta_1) \times \alpha_1 \times s(t) + a(\theta_2) \times \alpha_2 \times s(t) + \qquad (7)$$
$$a(\theta_1) \times \alpha_2 \times s(t) + a(\theta_2) \times \alpha_3 \times s(t) + \text{noise};$$

$$a(\theta) = \qquad (8)$$
$$\left[1, e^{j\pi \times \sin\theta}, e^{j\pi \times 4 \times \sin\theta}, e^{j\pi \times 6 \times \sin\theta}, e^{j\pi \times 9 \times \sin\theta}, e^{j\pi \times 10 \times \sin\theta}, e^{j\pi \times 13 \times \sin\theta}, e^{j\pi \times 15 \times \sin\theta}\right]^T;$$

$$\alpha_1 = e^{-j\frac{2\pi}{\lambda} \times 2 \times s1}; \qquad (9)$$

$$\alpha_2 = e^{-j\frac{2\pi}{\lambda} \times (s2+s1)} \times e^{j\times\beta(\theta_1)} \times \Gamma(\theta_1); \text{ and} \qquad (10)$$

$$\alpha_3 = e^{-j\frac{2\pi}{\lambda} \times 2 \times s2} \times e^{j\times 2 \times \beta(\theta_1)} \times \Gamma^2(\theta_1). \qquad (11)$$

In the aforementioned equations (10) and (11), $\beta(\theta_1)$ is a phase coefficient and is a phase change reflected by the reflection point 545 on the outer surface 544 of the vehicle 500. Although the theoretical value of the phase coefficient $\beta(\theta_1)$ is $\pi$ (i.e., 180 degrees), but from the phase distribution of the receiving signal X in equation (7), the phase coefficient $\beta(\theta_1)$ is related to the actual target angle $\theta_1$. $\Gamma(\theta_1)$ is an amplitude coefficient and is a ratio of an amplitude of the second path group or the third path group to an amplitude of the first path group, and the amplitude coefficient $\Gamma(\theta_1)$ is also related to the actual target angle $\theta_1$. The distribution of each of the amplitude coefficient $\Gamma(\theta_1)$ and the phase coefficient $\beta(\theta_1)$ with the angle will vary with different reflecting environments, and the analytical solution thereof cannot be obtained at present, but can only be obtained by comparing the simulated and measured receiving signals X. Further, equation (7) can be rearranged into the following equation (12). In equations (12) and (13), A is the steering matrix established according to the first path group coefficients, the second path group coefficients, the third path group coefficients, the fourth path group coefficients and the steering vectors, which are respectively corresponding to the first to fourth path group coefficients, of the receiving antennas 167. Equations (12) and (13) are as follows:

$$X = A \times s(t) + \text{noise} \qquad (12); \text{ and}$$

$$A = a(\theta_1) \times \alpha_1 + a(\theta_2) \times \alpha_2 + a(\theta_1) \times \alpha_2 + a(\theta_2) \times \alpha_3 \qquad (13).$$

Next, the receiving antennas 167 are caused to receive the receiving signal. In the normalizing step 240, the steering matrix is normalized with the component thereof corresponding to the reference antenna to obtain the normalized steering matrix while omitting noise term in equation (7) (i.e., omitting noise or other signal in the receiving signal X). The receiving signal X is normalized with the component thereof corresponding to the reference antenna to obtain the normalized receiving signal, and it can be obtained that the normalized steering matrix and the normalized receiving signal are equal vectors.

The radar sensing method 200 may further include a reflection coefficient obtaining step 250, which includes obtaining a reflection coefficient of each of the receiving antennas 167 according to the normalized steering matrix (e.g., by solving simultaneous equations). Each of the reflection coefficients includes the amplitude coefficient and the phase coefficient, and the reflection coefficient of each of the receiving antennas 167 is an analytical solution. In the following target angle table generating step 260, the target angle table 134 is generated further according to the reflection coefficients corresponding to the receiving antennas 167, respectively. Therefore, the reflection coefficient of each of the receiving antennas 167 being the analytical solution is beneficial to improve the sensing accuracy while calculating the position of the actual target t1 with controllable resources and time, so as to improve the sensing efficiency of the radar sensing method 200 and the radar sensing system 100.

Furthermore, the reflection coefficient obtaining step 250 may further include defining each of the amplitude coefficient and the phase coefficient of the reflection coefficient of the reference antenna to be constant. For example, the amplitude coefficient (e.g., the aforementioned amplitude coefficient $\Gamma(\theta_1)$) is defined to be 0.8, and the phase coefficient (e.g., the aforementioned phase coefficient $\beta(\theta_1)$) is defined to be 180 degrees (TT). Therefore, it is beneficial to save computing resources and time while improving the sensing accuracy.

The radar sensing method 200 may further include a target angle table storing step 270, which includes storing the target angle table 134 in the storage medium 130 of the control unit 110 of the radar sensing system 100 (or another radar system), so that the sensing error caused by the virtual mirror target t2 can be reduced while a subsequent after-calibrating sensing step 290 being performed.

After performing the target angle table storing step 270, the radar sensing method 200 may further include the after-calibrating sensing step 290, which includes calculating to obtain the steering matrix from the receiving signal corresponding to the steering matrix, and determining the actual target angle θ1 or the mirror target angle $\theta_2$ corresponding to the steering matrix according to the target angle table 134 so as to reduce the sensing error resulted from the mirror target t2. Therefore, the table looking up manner induced from the target angle table 134 in the radar sensing and calculating process is beneficial to obtain the sensing result that excludes or reduces the influence of the mirror target t2 by calculating and looking up the table with the receiving signal.

In the after-calibrating sensing step 290, a DML (Deterministic Maximum Likelihood) algorithm may be used. In the following equation (14), X is the receiving signal, which is complex data, A is the steering matrix and A=A($\theta_1$, $\theta_2$), which is related to the arrangement of the receiving antennas 167, and $X^H$ is a complex conjugate transpose matrix of the receiving signal X. Theoretically, when the receiving signal X and A×s(t) shown in equation (12) are the closest, a DML cost function in equation (14) can reach a maximum value, and the angle corresponding the steering matrix A while the maximum value being reached is the estimated actual target angle $\theta_1$. It should be noted that the angle relationship between the actual target angle $\theta_1$ and the mirror target angle $\theta_2$ has been obtained in the previous angle relationship obtaining step 210 (e.g., as shown in equation (6)), so the mirror target angle $\theta_2$ can be represented by the actual target angle $\theta_1$. Thus, the problem can be simplified to the estimation of only actual target angle $\theta_1$, that is, the two-dimensional DML cost function becomes a one-dimensional DML cost function. Equation (14) is as follows:

$$\theta_{DML} = \underset{\theta_1}{\mathrm{argmax}}\left\{X^H A \left(A^H A\right)^{-1} A^H X\right\}. \qquad (14)$$

Moreover, in the after-calibrating sensing step 290, the range of the mirror target angle $\theta_2$ can be limited first and then to estimate the actual target angle $\theta_1$. Thus, the estimating accuracy of the actual target angle $\theta_1$ can be improved, so that the radar sensing method 200 using the one-dimensional DML cost function is beneficial to not only reduce the amount of calculation but also improve the accuracy. In addition, a MUSIC (Multiple Signal Classification) algorithm may be used in the after-calibrating sensing step 290, but not limited thereto.

Figure 2B:
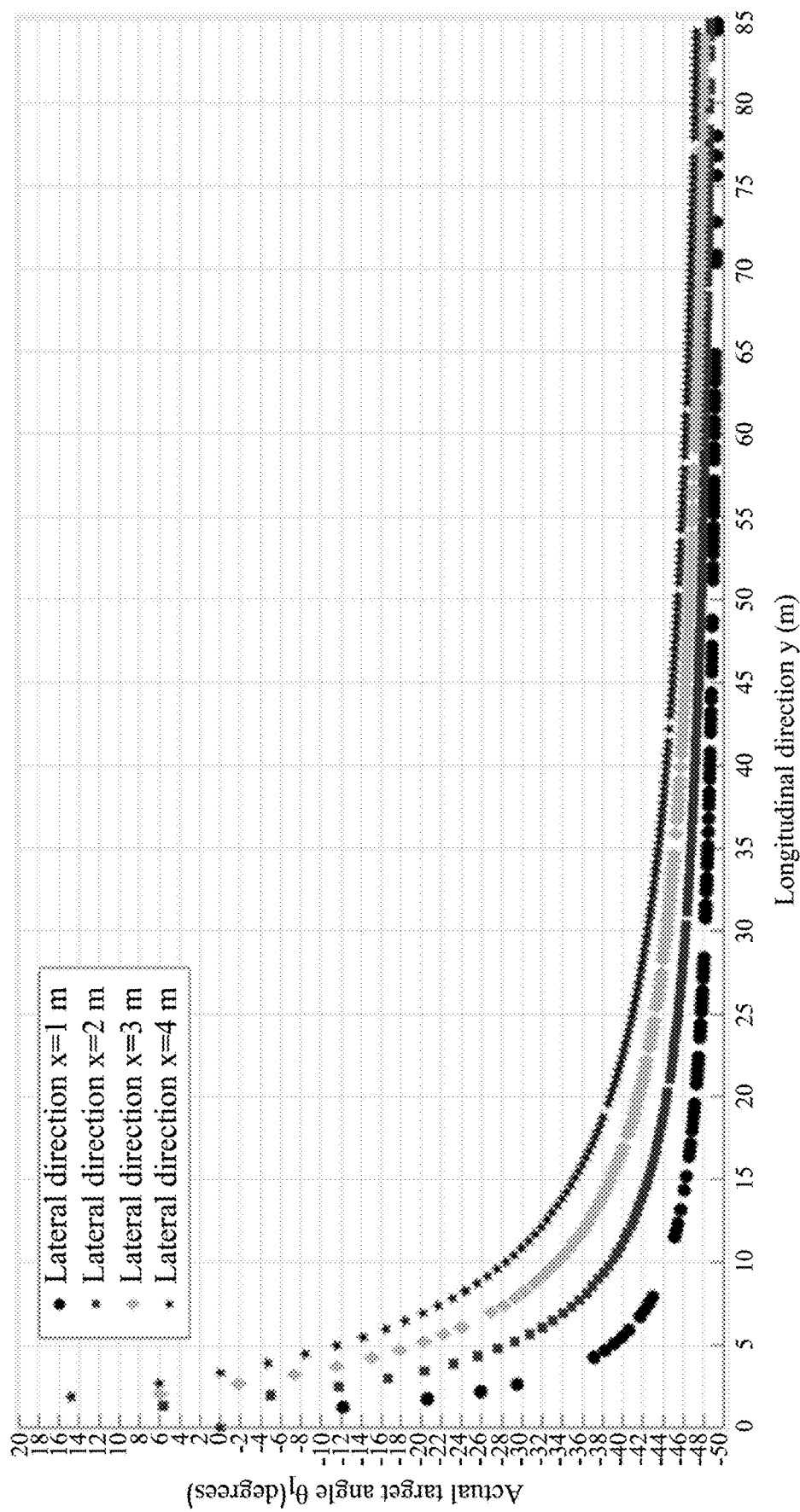
FIG. 2B is a relationship schematic view between an actual target angle and an actual target path of the radar sensing method according to the 2nd embodiment.

FIG. 2B is a relationship schematic view between the actual target angle $\theta_1$ and the actual target path s1 of the radar sensing method 200 according to the 2nd embodiment, which is under the conditions that the antenna plane 144 faces a rear portion 520 of the vehicle 500, and the antenna plane angle $\theta_p$ is 40 degrees. With reference to FIG. 2B, on a horizontal plane of the vehicle 50, an origin is defined at the position of one of the receiving antennas 167 (that is, the lateral direction x and the longitudinal direction y are both 0 m), and the relationship among distances along the lateral direction x, the longitudinal direction y from the receiving antenna 167 to the actual target t1, and the actual target angle $\theta_1$ is shown in FIG. 2B. Further, the radar sensing system 100 for implementing the radar sensing method 200 can accurately sense the actual target $t_1$ located between 1 m and 5 m along the lateral direction x (actually, the maximum lateral sensing distance can be greater than 5 m) and between 0 m and −100 m along the longitudinal direction y.

Figure 2C:
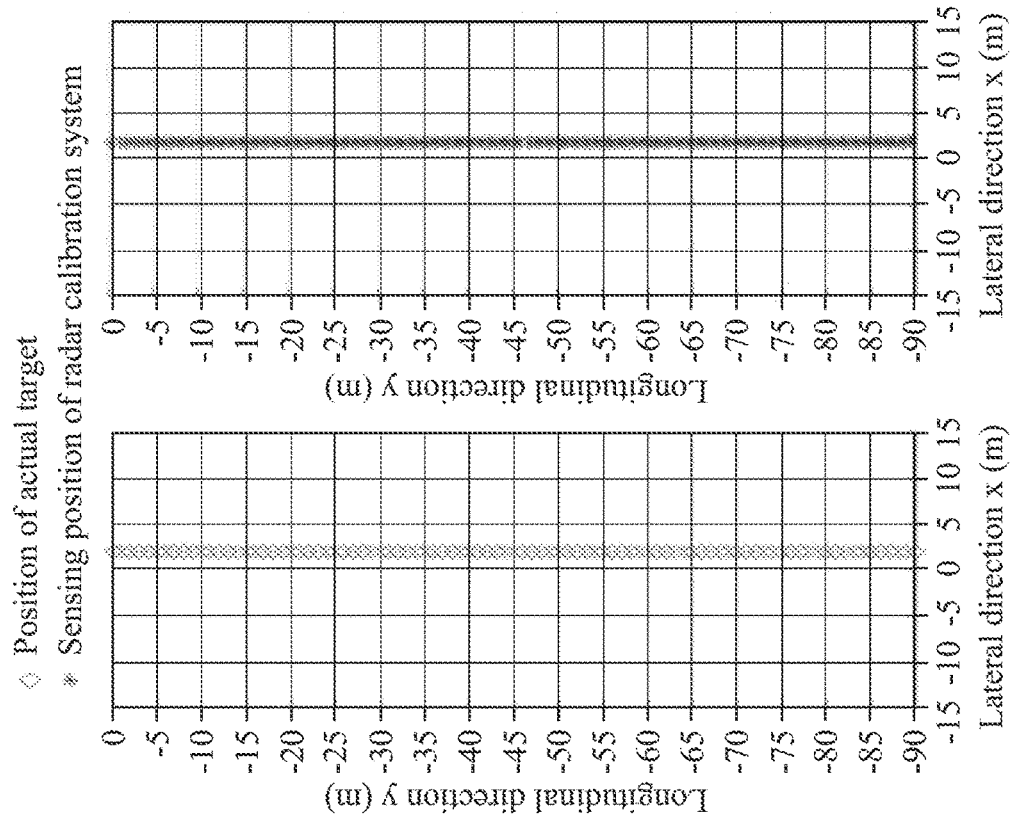
FIG. 2C is a schematic view for comparing of a sensing result of a conventional radar system sensing an actual target being a cone-shaped reflector.
Figure 2D:
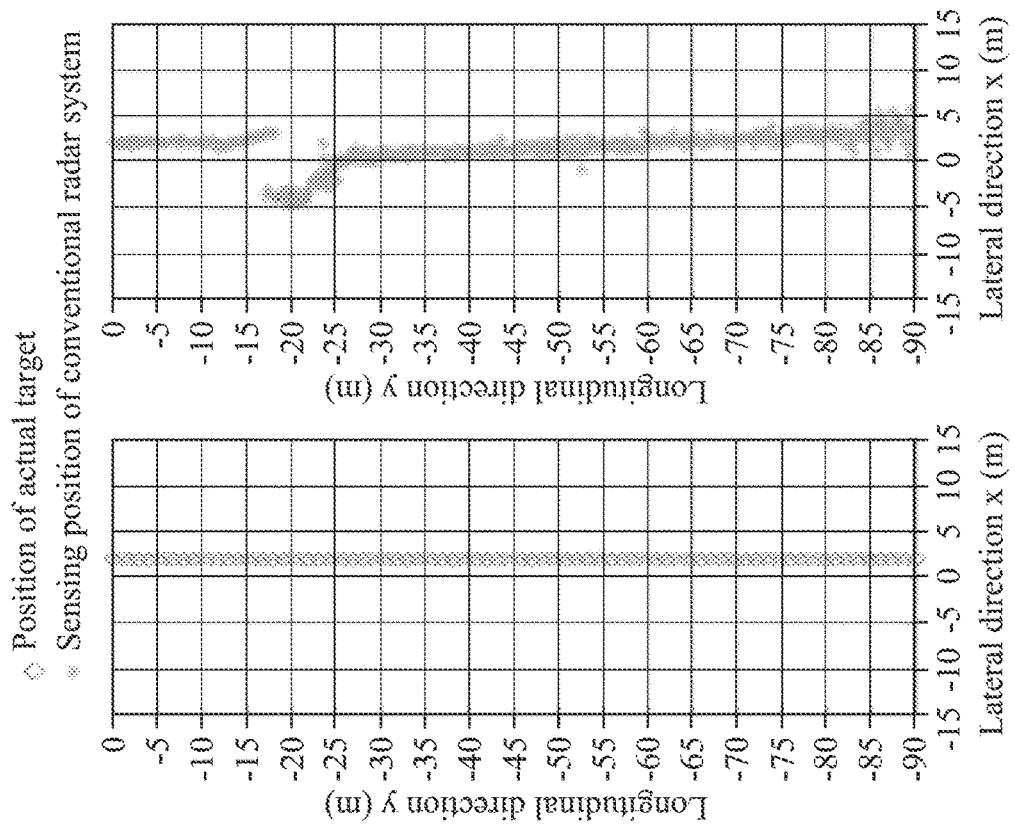
FIG. 2D is a schematic view of a sensing result of the radar sensing method according to the 2nd embodiment sensing the actual target being the cone-shaped reflector.
Figure 2F:
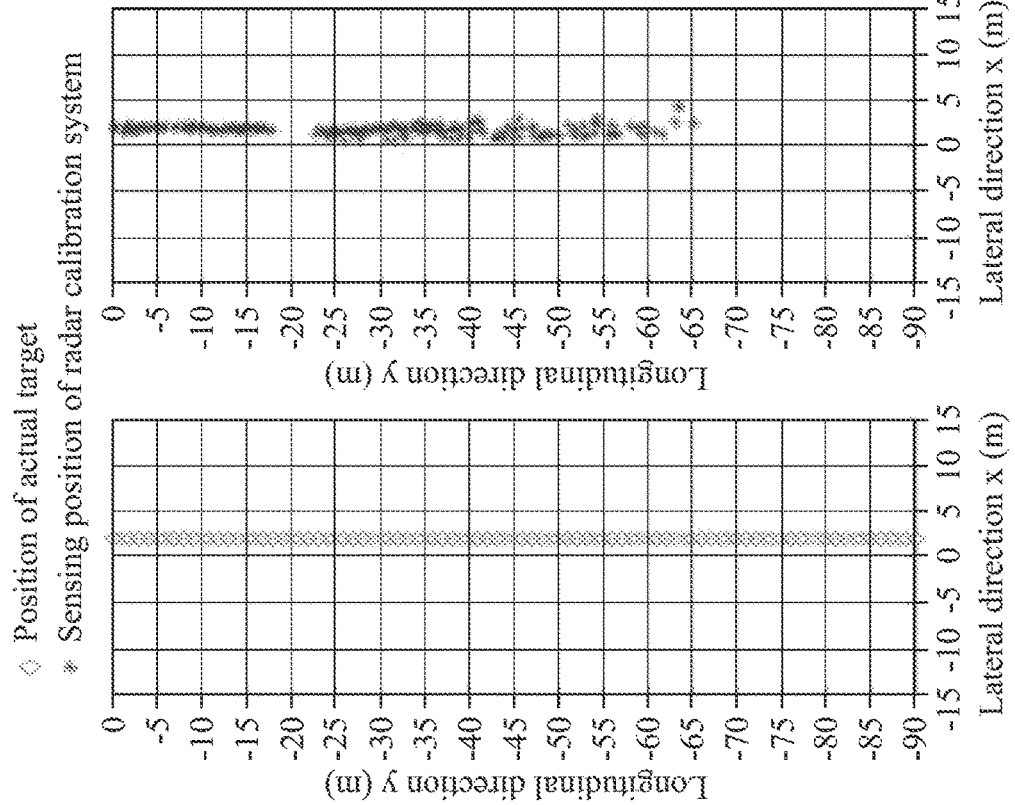
FIG. 2F is a schematic view of a sensing result of the radar sensing method according to the 2nd embodiment sensing the actual target being the bicycle.
Figure 2E:
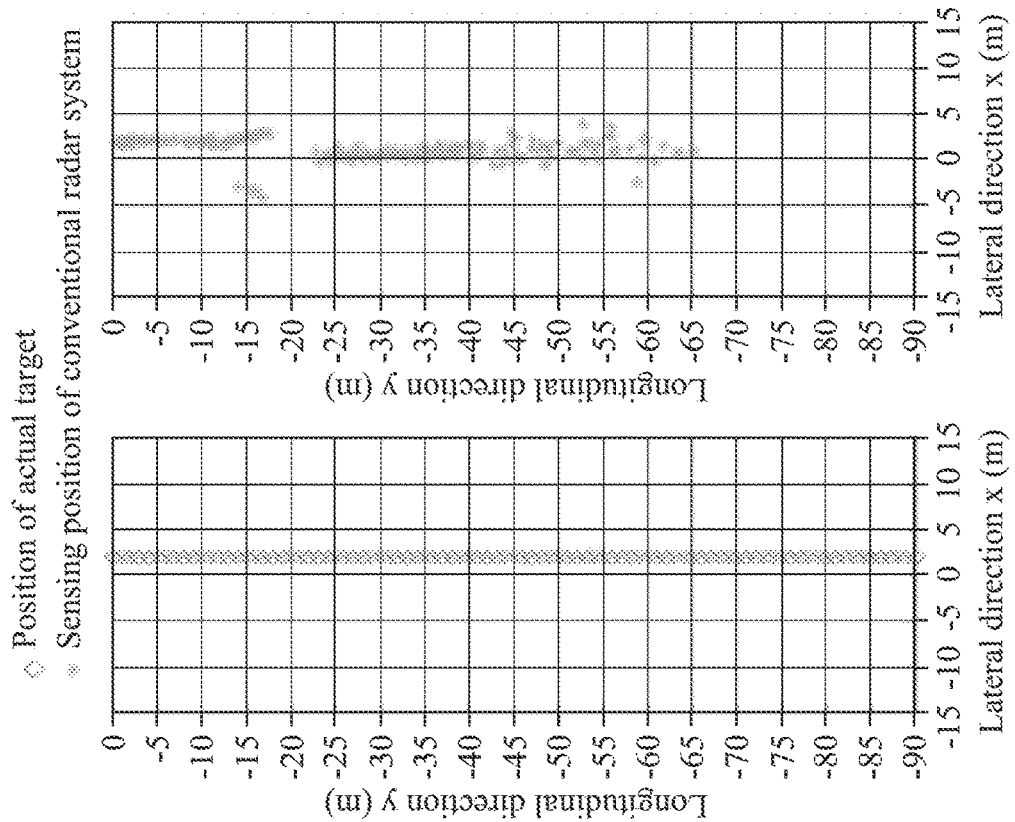
FIG. 2E is a schematic view for comparing of a sensing result of a conventional radar system sensing an actual target being a bicycle.
Figure 2H:
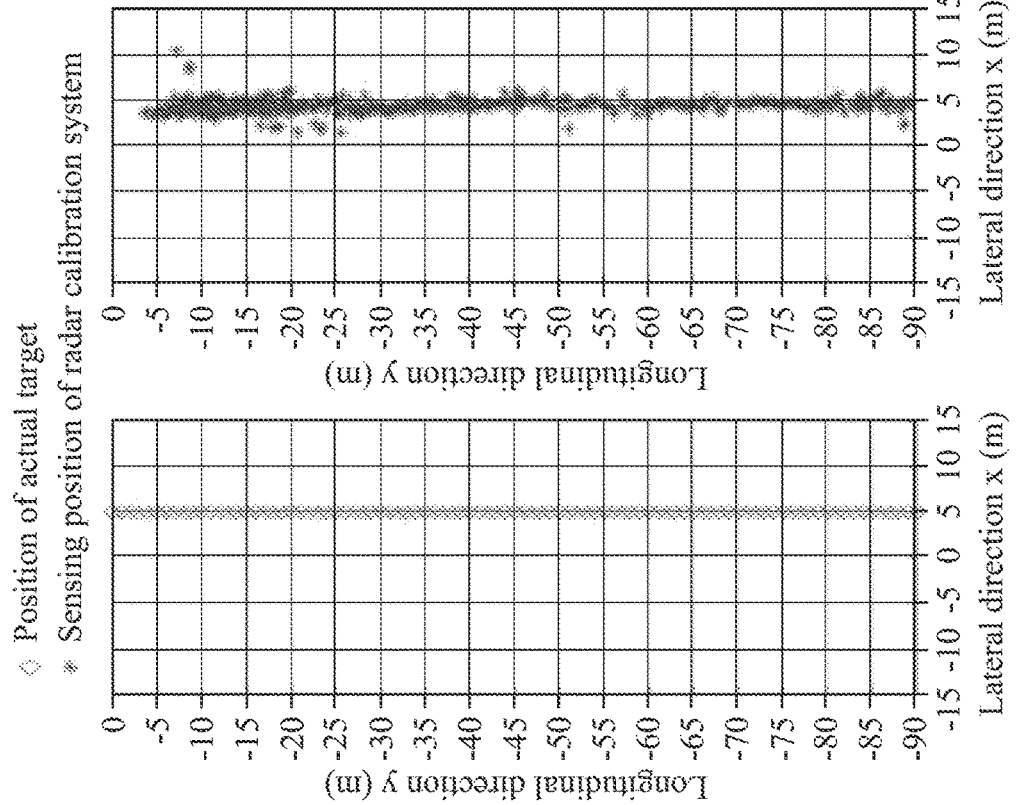
FIG. 2H is a schematic view of a sensing result of the radar sensing method according to the 2nd embodiment sensing the actual target being the car.
Figure 2G:
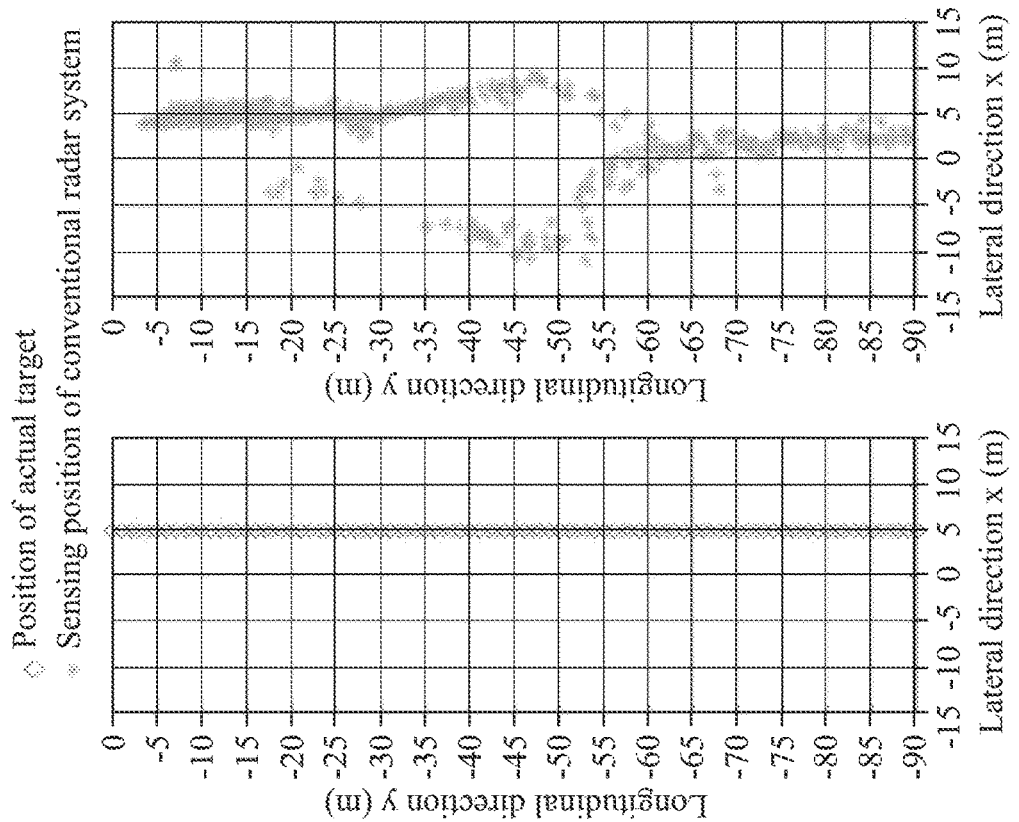
FIG. 2G is a schematic view for comparing of a sensing result of a conventional radar system sensing an actual target being a car.
Figure 2J:
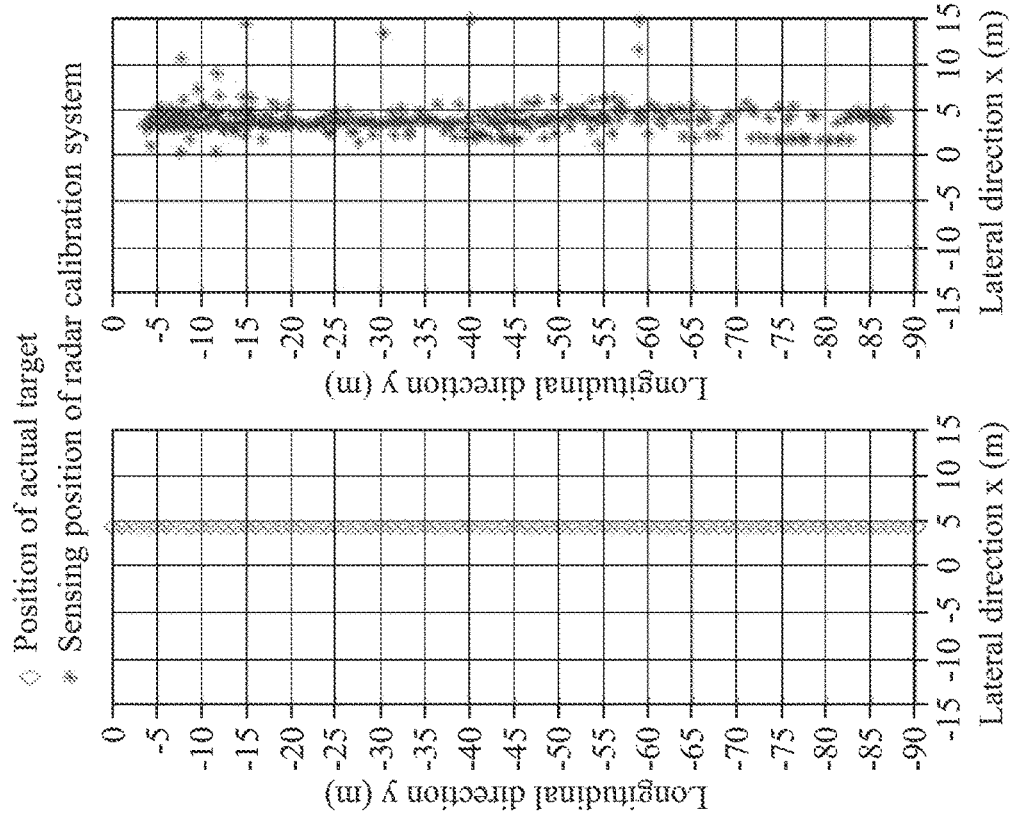
FIG. 2J is a schematic view of another sensing result of the radar sensing method according to the 2nd embodiment sensing the actual target being the car.
Figure 2I:
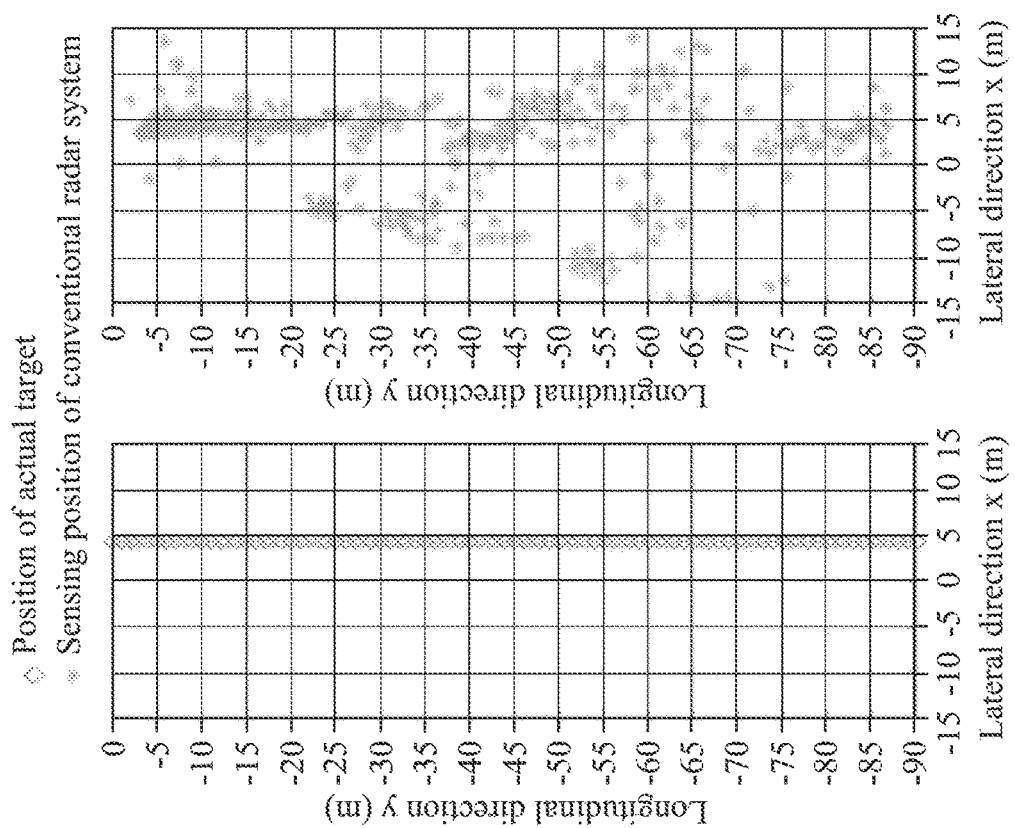
FIG. 2I is a schematic view for comparing of another sensing result of the conventional radar system sensing the actual target being the car.
Figure 2L:
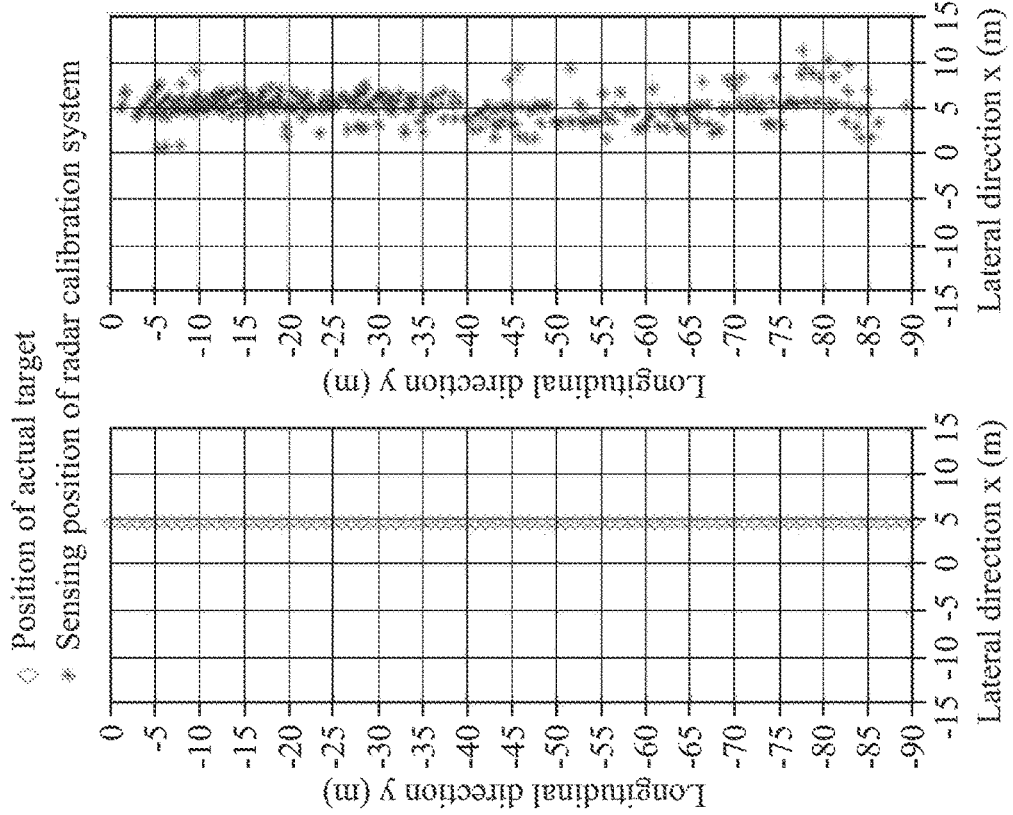
FIG. 2L is a schematic view of further another sensing result of the radar sensing method according to the 2nd embodiment sensing the actual target being the car.
Figure 2K:
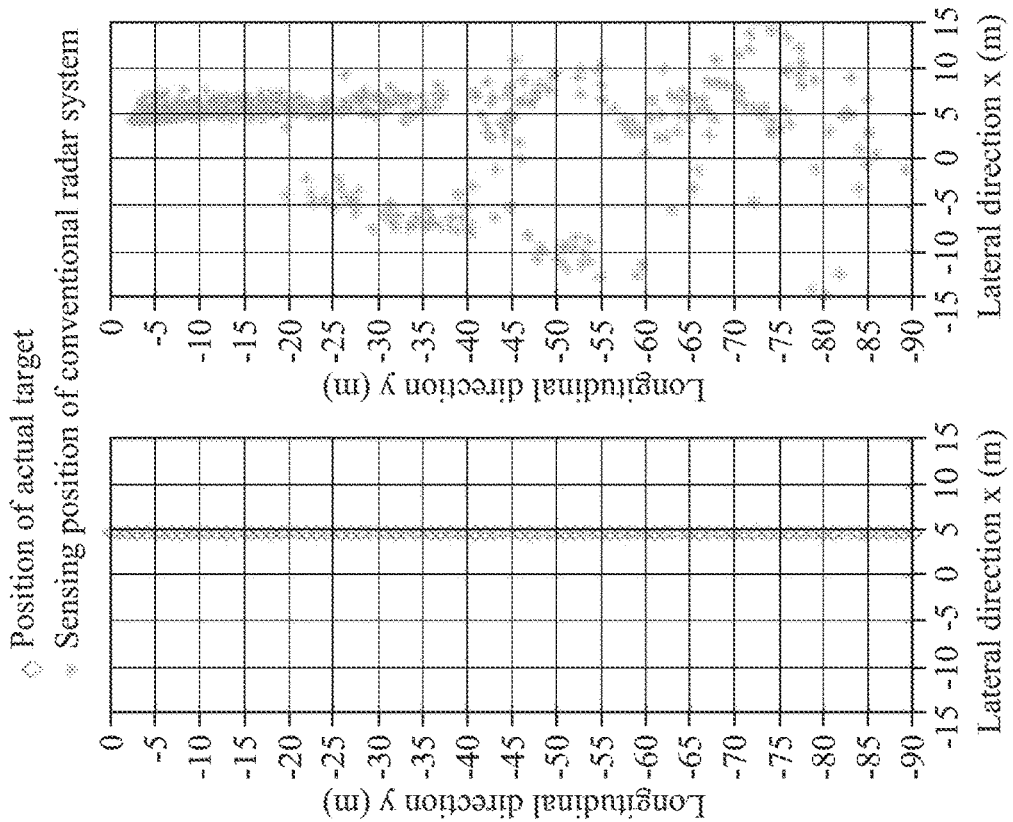
FIG. 2K is a schematic view for comparing of further another sensing result of the conventional radar system sensing the actual target being the car.

FIG. 2C is a schematic view for comparing of a sensing result of a conventional radar system sensing the actual target t1 being a cone-shaped reflector, and FIG. 2D is a schematic view of a sensing result of the radar sensing method 200 according to the 2nd embodiment sensing the actual target t1 being the cone-shaped reflector. FIG. 2E is a schematic view for comparing of a sensing result of a conventional radar system sensing the actual target t1 being a bicycle, and FIG. 2F is a schematic view of a sensing result of the radar sensing method 200 according to the 2nd embodiment sensing the actual target t1 being the bicycle. FIG. 2G is a schematic view for comparing of a sensing result of a conventional radar system sensing the actual target t1 being a car, when a vertical distance between a bottom surface of a housing of the conventional radar system and an outer surface of a vehicle is 0 cm. FIG. 2H is a schematic view of a sensing result of the radar sensing method 200 according to the 2nd embodiment sensing the actual target t1 being the car, when the vertical distance between the bottom surface 177 of the housing 170 of the radar sensing system 100 implementing the radar sensing method 200 and the outer surface 544 of the vehicle 500 is 0 cm. FIG. 2I is a schematic view for comparing of another sensing result of the conventional radar system sensing the actual target t1 being the car, when the vertical distance between the bottom surface of the housing of the conventional radar system and the outer surface of the vehicle is 3 cm. FIG. 2J is a schematic view of another sensing result of the radar sensing method 200 according to the 2nd embodiment sensing the actual target t1 being the car, when the vertical distance between the bottom surface 177 of the housing 170 of the radar sensing system 100 implementing the radar sensing method 200 and the outer surface 544 of the vehicle 500 is 3 cm. FIG. 2K is a schematic view for comparing of further another sensing result of the conventional radar system sensing the actual target t1 being the car, when the vertical distance between the bottom surface of the housing of the conventional radar system and the outer surface of the vehicle is 5 cm. FIG. 2L is a schematic view of further another sensing result of the radar sensing method 200 according to the 2nd embodiment sensing the actual target t1 being the car, when the vertical distance between the bottom surface 177 of the housing 170 of the radar sensing system 100 implementing the radar sensing method 200 and the outer surface 544 of the vehicle 500 is 5 cm. Specifically, each of FIG. 2C to FIG. 2L is shown on the horizontal plane of the vehicle, wherein the origin is defined at the position of one of the receiving antennas, a position away from the outer surface of the vehicle in the lateral direction x is positive, and a position close to the rear portion of the vehicle (or toward the rear portion of the vehicle) in the longitudinal direction y is negative, the antenna plane faces the rear portion of the vehicle, and the antenna plane angle is 40 degrees. Furthermore, the vertical distance between the receiving antenna center and the bottom surface of the housing in each of FIG. 2C to FIG. 2L is 1.5 cm. Thus, the vertical distance between the receiving antenna center and the outer surface of the vehicle in each of FIG. 2C to FIG. 2H is 1.5 cm, the vertical distance between the receiving antenna center and the outer surface of the vehicle in each of FIG. 2I and FIG. 2J is 4.5 cm, and the vertical distance between the receiving antenna center and the outer surface of the vehicle in each of FIG. 2K and FIG. 2L is 6.5 cm.

With reference to FIG. 2C and FIG. 2D, the actual target shown in each of FIG. 2C and FIG. 2D is the corn-shaped reflector and is 2 m away from the receiving antenna as the origin in the lateral direction x. As shown in FIG. 2C, there are more obvious sensing errors in the sensing result of the conventional radar system, that is, along the longitudinal direction y, there are several sensing positions in the lateral direction x are not 2 m, especially the sensing positions in the lateral direction x are smaller than 2 m or smaller than 0 m. However, the sensing result of the radar sensing system 100 shown in FIG. 2D is beneficial to effectively reduce the sensing errors.

With reference to FIG. 2E and FIG. 2F, the actual target shown in each of FIG. 2E and FIG. 2F is the bicycle and is 2 m away from the receiving antenna as the origin in the lateral direction x. As shown in FIG. 2E, there are more obvious sensing errors in the sensing result of the conventional radar system, that is, along the longitudinal direction y, there are several sensing positions in the lateral direction x are not 2 m, especially the sensing positions in the lateral direction x are smaller than 2 m or smaller than 0 m. However, the sensing result of the radar sensing system 100 shown in FIG. 2F is beneficial to effectively reduce the sensing errors.

With reference to FIG. 2G to FIG. 2L, the actual target shown in each of FIG. 2G to FIG. 2L is the car and is 5 m away from the receiving antenna as the origin in the lateral direction x. As shown in FIG. 2G, FIG. 2I and FIG. 2K, there are more obvious sensing errors in the sensing results of the conventional radar system, that is, along the longitudinal direction y, there are several sensing positions in the lateral direction x are not 5 m, especially the sensing positions in the lateral direction x are smaller than 5 m or smaller than 0 m. However, the sensing results of the radar sensing system 100 shown in FIG. 2H, FIG. 2J and FIG. 2L are beneficial to effectively reduce the sensing errors.

Figure 3A:
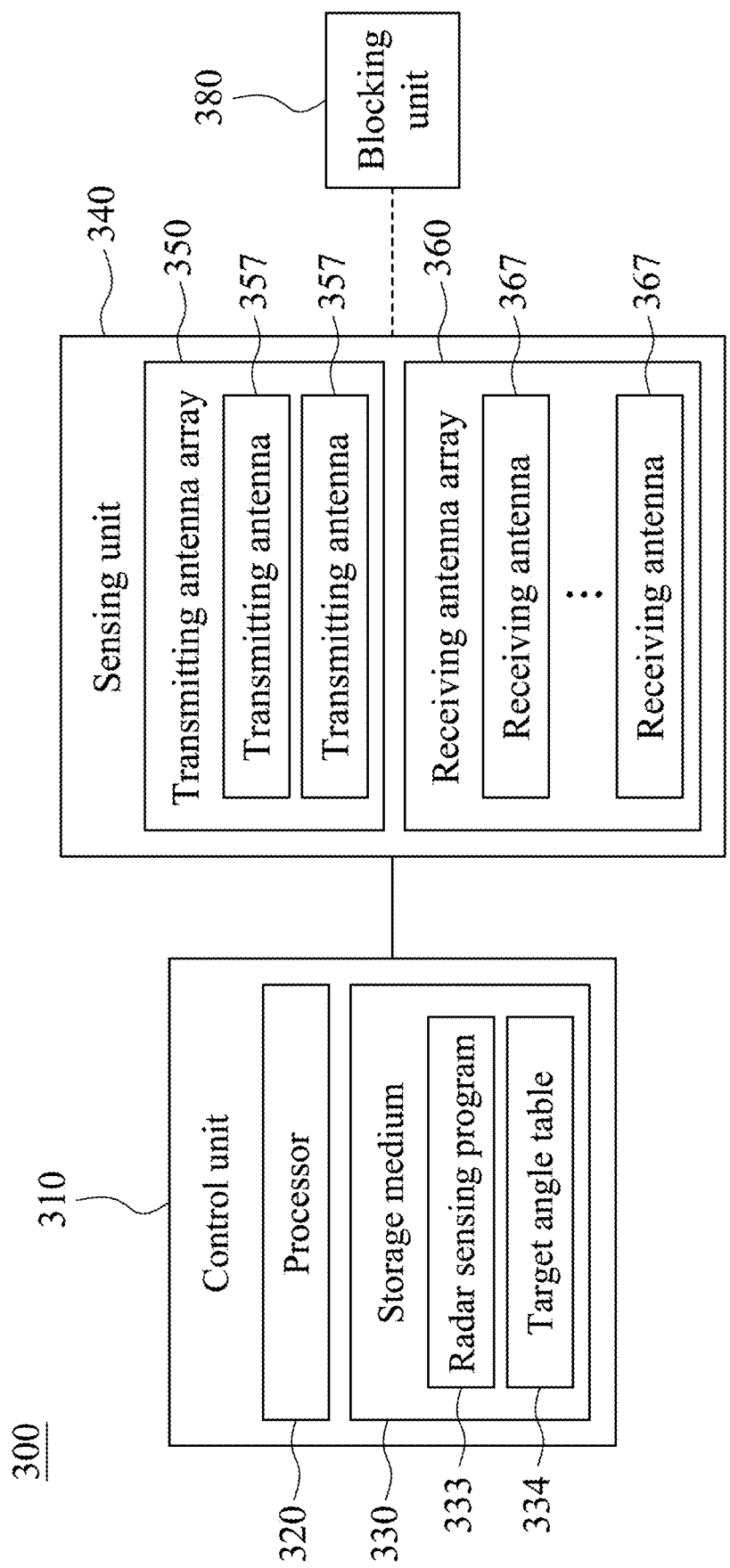
FIG. 3A is a block diagram of a radar sensing system according to the 3rd embodiment of the present disclosure.
Figure 3B:
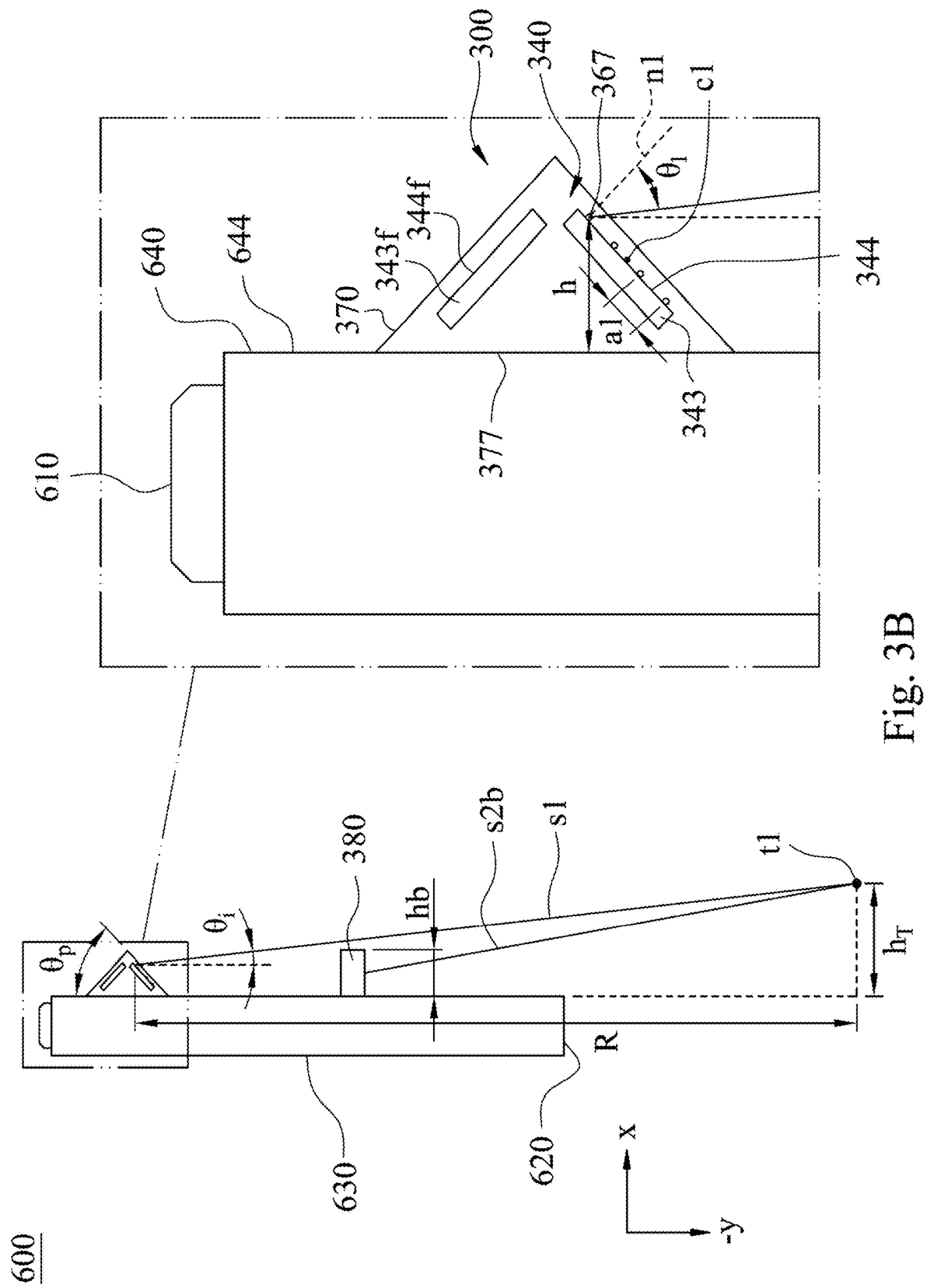
FIG. 3B is a schematic view of the radar sensing system according to the 3rd embodiment in a usage state.

FIG. 3A is a block diagram of a radar sensing system 300 according to the 3rd embodiment of the present disclosure, and FIG. 3B is a schematic view of the radar sensing system 300 according to the 3rd embodiment in a usage state (not shown in an actual scale). With reference to FIG. 3A and FIG. 3B, the radar sensing system 300 is for being disposed on a vehicle 600. The radar sensing system 300 includes a sensing unit 340, a control unit 310 and a housing 370. The sensing unit 340 includes a receiving antenna array 360, which includes at least three receiving antennas 367. The receiving antennas 367 are arranged on an antenna plane 344 and have a receiving antenna center c1. The receiving antennas 367 are arranged symmetrically with respect to the receiving antenna center c1. There is a receiving antenna spacing a1 between each adjacent two of the receiving antennas 367, and the receiving antenna spacings a1 are equal. The housing 370 includes a bottom surface 377, which is directly attached on an outer surface 644 of the vehicle 600. That is, a vertical distance between the bottom surface 377 and the outer surface 644 is substantially zero. The sensing unit 340 is disposed in the housing 370. An antenna plane angle $\theta_p$ between the antenna plane 344 and the outer surface 644 of the vehicle 600 is in a range of 0 degrees to 90 degrees. A vertical distance hc between the receiving antenna center c1 and the bottom surface 377 of the housing 370 is smaller than or equal to 2 cm. In addition, a distance between the receiving antenna center c1 and a ground plane may be greater than 40 cm.

The control unit 310 is communicatively coupled to the receiving antennas 367. The control unit 310 includes a processor 320 and a storage medium 330. The storage medium 330 is communicatively coupled to the processor 320 and may be configured to provide a radar sensing program 333 and a target angle table 334. The target angle table 334 includes actual target angles $\theta_1$ or mirror target angles $\theta_2$. The control unit 310, according to the radar sensing program 333 and the target angle table 334, is for reducing a sensing error resulted from a mirror target, which is virtual.

Figure 3E:
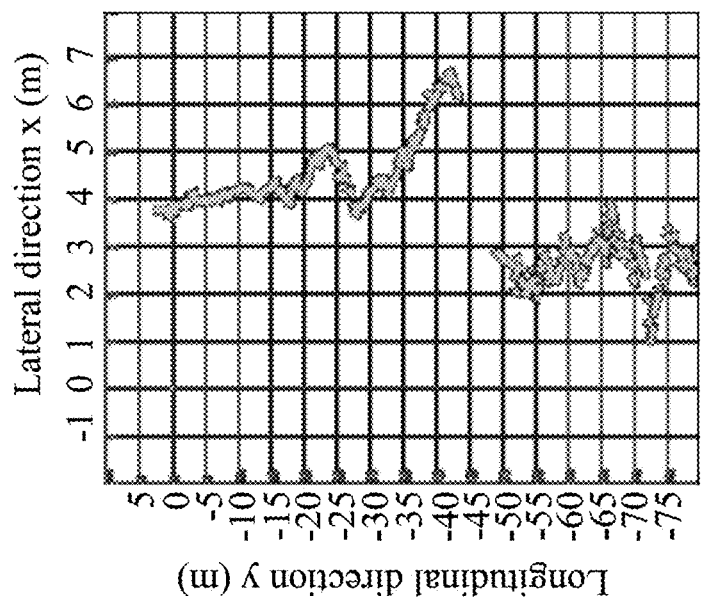
FIG. 3E, FIG. 3F, FIG. 3G and FIG. 3H are schematic views of sensing results of the radar sensing system according to the 3rd embodiment with different blocking configurations, respectively.
Figure 3D:
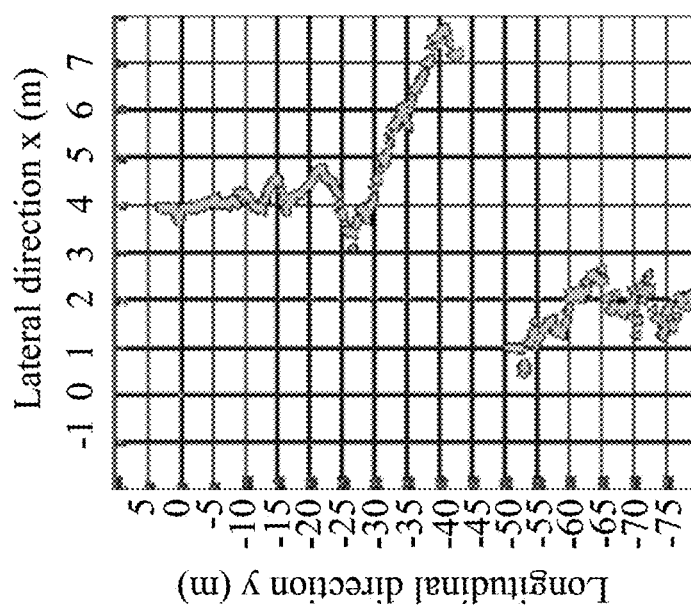
FIG. 3D is a schematic view for comparing of a sensing result of the conventional radar system.
Figure 3C:
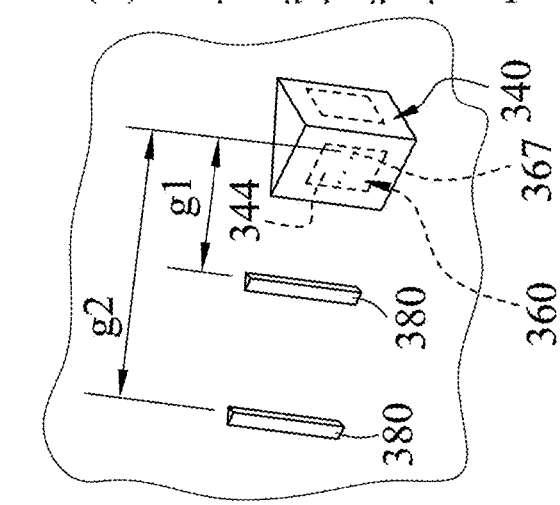
FIG. 3C is a schematic view of blocking units of the radar sensing system according to the 3rd embodiment.

FIG. 3C is a schematic view of blocking units 380 of the radar sensing system 300 according to the 3rd embodiment. With reference to FIG. 3A to FIG. 3C, the radar sensing system 300 further includes at least one blocking unit 380, which is disposed on the outer surface 644 of the vehicle 600 for blocking a reflected signal of the mirror target. An average surface roughness of the blocking unit 380 is smaller than 5 cm. The sensing unit 340 and the blocking unit 380 are arranged on a horizontal plane of the vehicle 600 along a direction from a front portion 610 of the vehicle 600 to a rear portion 620 thereof in order. The sensing unit 340 is for sensing the actual target t1, and a distance along a lateral direction x of the vehicle 600 between the receiving antenna center c1 and the actual target t1 is in a range of 1 m to 5 m. Therefore, it is advantageous in improving the sensing accuracy for a rear target while the vehicle 600 moving forward, backward and turning, and effectively preventing accidents caused by radius difference between inner wheels. Furthermore, the vehicle 600 may be a single vehicle or a tractor connecting to a trailer. The sensing unit 340 and the blocking unit 380 may be integrated into one device, or two separated devices such as shown in FIG. 3B and FIG. 3C. In addition, a distance along a longitudinal direction y of the vehicle 600 between the receiving antenna center c1 and the actual target t1 may be greater than 30 m and smaller than 100 m.

With reference to FIG. 3B, when a vertical distance between any of the receiving antennas 367 and the outer surface 644 of the vehicle 600 is h, and a vertical height of the blocking unit 380 from the outer surface 644 is hb, the following condition may be satisfied: $0<hb/h<0.4$. Therefore, it is beneficial to exclude or reduce the influence of the mirror target in the sensing result.

With reference to FIG. 3B and FIG. 3C, a spacing (e.g., spacings g1, g2 in FIG. 3C) between any of the receiving antennas 367 and the blocking unit 380 may be in a range of 5 cm to 70 cm, and the blocking unit 380 is made of at least one of an absorbing material and a metal material. Therefore, the signal reflected from the actual target t1 through the path s2b can be effectively blocked by the blocking unit 380, so that the signal will not be received by the receiving antenna 367. Furthermore, when the blocking unit 380 is made of the absorbing material, e.g., a radio frequency absorber (RF absorber) or an absorbing material with an average surface roughness smaller than 5 cm but no microstructure, the blocking unit 380 can absorb the signal reflected or scattered from the actual target t1 through the path s2b in FIG. 3B. When the blocking unit 380 is made of the metal material, the blocking unit 380 can reflect or scatter the signal reflected from the actual target t1 through the path s2b. The blocking unit 380 can also have a surface treatment, such as a multilayer film, to absorb, reflect or scatter the signal reflected to the blocking unit 380 through the path s2b. A shape of the blocking unit 380 may be rectangular, triangular, circular, conical, or a block of a combination thereof, and is not limited thereto.

Figure 3H:
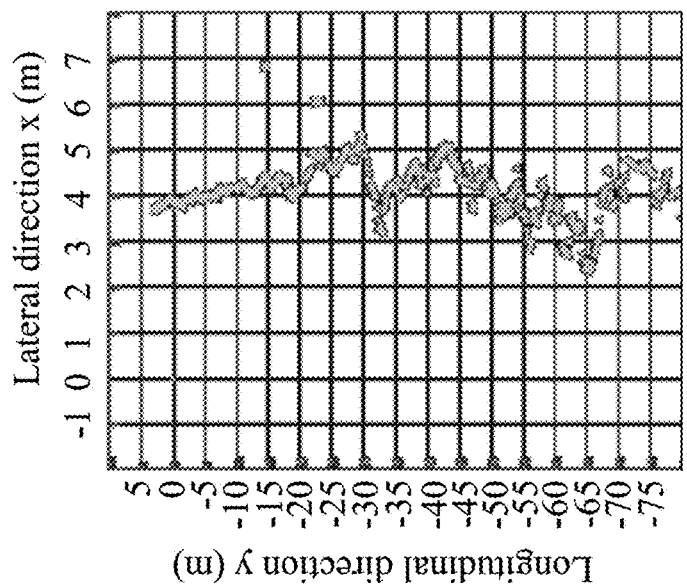
Figure 3G:
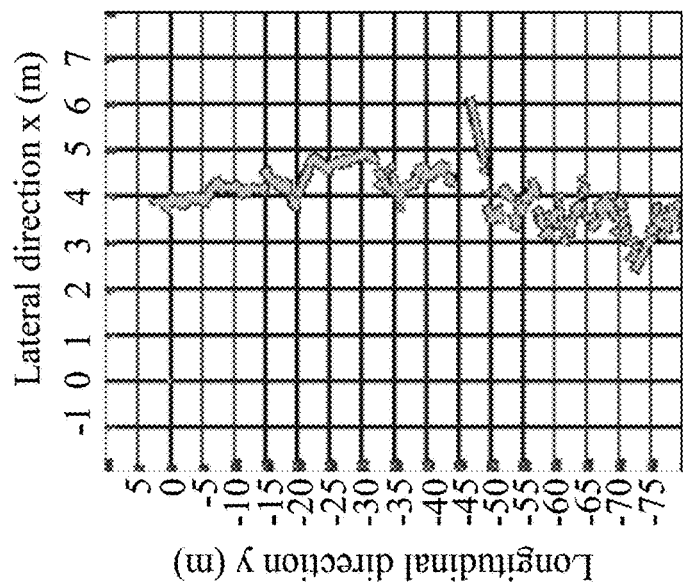
Figure 3F:
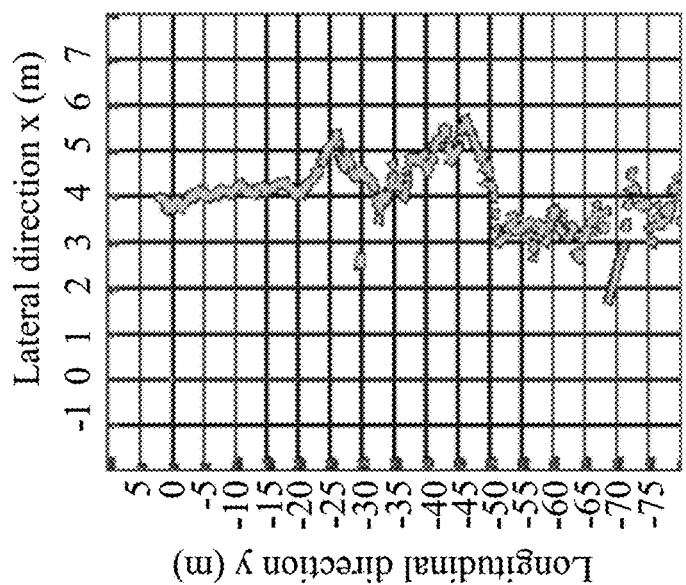
Figure 4:
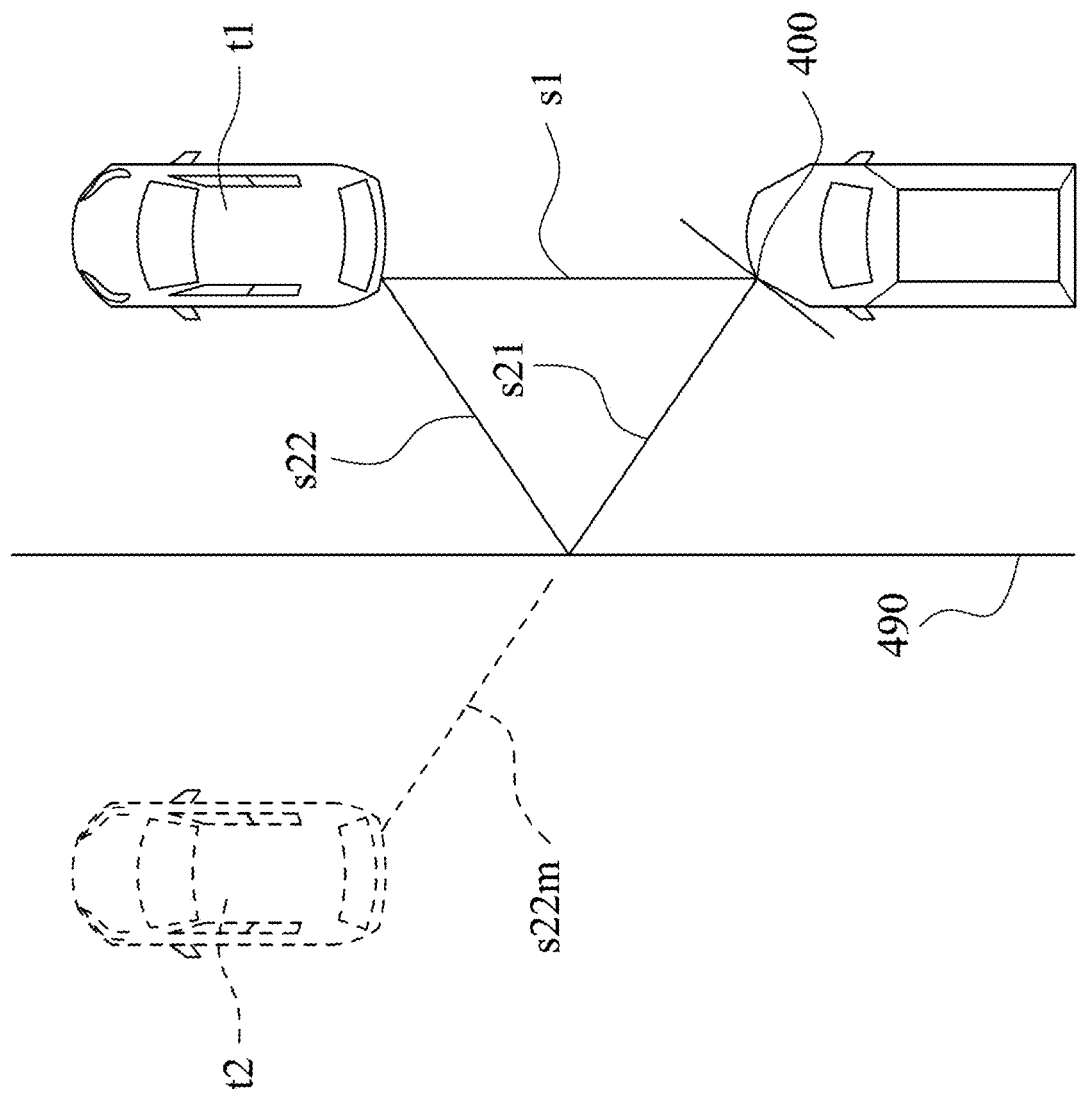
FIG. 4 is a schematic view of the conventional radar system in a usage state.

FIG. 3D is a schematic view for comparing of a sensing result of the conventional radar system, and FIG. 3E, FIG. 3F, FIG. 3G and FIG. 3H are schematic views of sensing results of the radar sensing system 300 according to the 3rd embodiment with different blocking configurations, respectively. With reference to FIG. 3D to FIG. 3H, FIG. 3D to FIG. 3H show that the actual target t1 is located at 4 m in the lateral direction x as a sensing position, wherein a position of one of the receiving antennas 367 is an origin, and FIG. 3D is the schematic view of the sensing result of the conventional radar system without blocking unit. FIG. 3E is the schematic view of the sensing result of the radar sensing system 300 including one blocking unit 380, and the blocking unit 380 is disposed in a direction toward the rear portion 620 of the vehicle 600 and has a spacing along the longitudinal direction y being 7.5 cm with respect to the receiving antennas 367. FIG. 3F is the schematic view of the sensing result of the radar sensing system 300 including two blocking units 380, and the two blocking units 380 are disposed in the direction toward the rear portion 620 of the vehicle 600 and have spacings along the longitudinal direction y being 7.5 cm and 15 cm, respectively, with respect to the receiving antennas 367, such as the spacings g1, g2 being 7.5 cm and 15 cm, respectively, in FIG. 3C. FIG. 3G is the schematic view of the sensing result of the radar sensing system 300 including three blocking units 380, and the three blocking units 380 are disposed in the direction toward the rear portion 620 of the vehicle 600 and have spacings along the longitudinal direction y being 7.5 cm, 15 cm and 30 cm, respectively, with respect to the receiving antennas 367. FIG. 3H is the schematic view of the sensing result of the radar sensing system 300 including four blocking units 380, and the four blocking units 380 are disposed in the direction toward the rear portion 620 of the vehicle 600 and have spacings along the longitudinal direction y being 7.5 cm, 15 cm, 30 cm and 60 cm, respectively, with respect to the receiving antennas 367.

The sensing result of the conventional radar system shown in FIG. 3D have more obvious sensing errors. The actual target t1 located at about −30 m to −45 m in the longitudinal direction y has the sensing positions greater than 4 m in the lateral direction x, which may be related to the field of view (FOV) characteristics of the conventional radar system, and the actual target t1 located at about −50 m to −85 m in the longitudinal direction y has the sensing positions smaller than 4 m in the lateral direction x. However, the sensing results of the radar sensing system 300 shown in FIG. 3E to FIG. 3H are beneficial to effectively reduce the sensing errors, especially enhance the sensing correctness for the actual target t1 located at being smaller −30 m in the longitudinal direction y.

In addition, with reference to FIG. 3A and FIG. 3B, the sensing unit 340 further includes a transmitting antenna array 350, which includes at least one transmitting antenna 357, and the transmitting antenna 357 is arranged on the antenna plane 344. The outer surface 644 of the vehicle 600 may be located on a left portion 630 of the vehicle 600 or a right portion 640 thereof. The vertical distance between the bottom surface 377 of the housing 370 and the outer surface 644 may be substantially zero or not zero, and a vertical distance between the receiving antenna center c1 and the outer surface 644 is smaller than or equal 6.5 cm. Furthermore, the vertical distance between the receiving antenna center c1 and the outer surface 644 may be greater than or equal 1.0 cm and smaller than or equal 6.5 cm.

Specifically, a number of the receiving antennas 367 is four, the receiving antennas 367 are arranged on a horizontal plane of the vehicle 600 in order, and all of the receiving antenna spacings a1 are equal. The antenna plane angle $\theta_p$ is in a range of 30 degrees to 50 degrees. In FIG. 3B, R is a distance along the longitudinal direction y between one of the receiving antennas 367 and the actual target t1, $\theta_i$ is an angle between an actual target path s1 and the longitudinal direction y, and $h_T$ is a vertical distance between the actual target t1 and the outer surface 644 of the vehicle 600.

Regarding other details of the radar sensing system 300 of the 3rd embodiment, the contents of the radar sensing system 100 of the 1st embodiment and the radar sensing method 200 of the 2nd embodiment being aforementioned can be referred, and the details are not described again herein.

Although the present disclosure has been described in considerable detail with reference to certain embodiments thereof, other embodiments are possible. Therefore, the spirit and scope of the appended claims should not be limited to the description of the embodiments contained herein. It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A radar sensing system, for being disposed on a vehicle and comprising:
a sensing unit comprising a receiving antenna array, which comprises at least four receiving antennas, wherein the receiving antennas are arranged on an antenna plane and have a receiving antenna center, a distance between the receiving antenna center and a ground plane is greater than 40 cm, the receiving antennas are arranged asymmetrically with respect to the receiving antenna center, there is a receiving antenna spacing between each adjacent two of the receiving antennas, and the receiving antenna spacings have ratios of 1:3:2 in order; and
a housing comprising a bottom surface, which is attached on an outer surface of the vehicle, wherein the sensing unit is disposed in the housing, an antenna plane angle between the antenna plane and the outer surface of the vehicle is in a range of 0 degrees to 90 degrees, and a vertical distance between the receiving antenna center and the bottom surface is smaller than or equal to 2 cm;
wherein the sensing unit is for sensing an actual target, and a distance along a longitudinal direction of the vehicle between the receiving antenna in center and the actual target is greater than 30 m and smaller than 100 m.

2. The radar sensing system of claim 1, wherein the sensing unit further comprises a transmitting antenna array, which comprises at least one transmitting antenna, the at least one transmitting antenna is arranged on the antenna plane, and the outer surface is located on a left portion of the vehicle or a right portion thereof.

3. The radar sensing system of claim 1, wherein the receiving antennas are arranged on a horizontal plane of the vehicle in order, and the receiving antenna spacings along a direction from being away from the outer surface to being adjacent to the outer surface have ratios of 1:3:2 in order.

4. The radar sensing system of claim 1, wherein the antenna plane angle is in a range of 30 degrees to 50 degrees.

5. A radar sensing system, for being disposed on a vehicle and comprising:
a sensing unit comprising a receiving antenna array, which comprises at least three receiving antennas, wherein the receiving antennas are arranged on an antenna plane and have a receiving antenna center, the receiving antennas are arranged symmetrically with respect to the receiving antenna center, there is a receiving antenna spacing between each adjacent two of the receiving antennas, and the receiving antenna spacings are equal;
a housing comprising a bottom surface, which is attached on an outer surface of the vehicle, wherein the sensing unit is disposed in the housing, an antenna plane angle between the antenna plane and the outer surface of the vehicle is in a range of 0 degrees to 90 degrees, and a vertical distance between the receiving antenna center and the bottom surface is smaller than or equal to 2 cm; and
at least one blocking unit disposed on the outer surface of the vehicle for blocking a reflected signal of a mirror target, which is virtual, wherein an average surface roughness of the at least one blocking unit is smaller than 5 cm;
wherein the sensing unit is for sensing an actual target, and a distance along a lateral direction of the vehicle between the receiving antenna center and the actual target is in a range of 1 m to 5 m.

6. The radar sensing system of claim 5, wherein the sensing unit and the at least one blocking unit are arranged on a horizontal plane of the vehicle along a direction from a front portion of the vehicle to a rear portion thereof in order.

7. The radar sensing system of claim 5, wherein a vertical distance between any of the receiving antennas and the outer surface of the vehicle is h, a vertical height of the at least one blocking unit from the outer surface is hb, and the following condition is satisfied:

$$0 < hb/h < 0.4.$$

8. The radar sensing system of claim 5, wherein a spacing between any of the receiving antennas and the at least one blocking unit is in a range of 5 cm to 70 cm, and the at least one blocking unit is made of at least one of an absorbing material and a metal material.

9. A radar sensing method, applied to a radar sensing system of a vehicle, wherein the radar sensing system comprises a sensing unit, the sensing unit is disposed on an outer surface of the vehicle and comprises a receiving antenna array, which comprises a plurality of receiving antennas, the receiving antennas are arranged on an antenna plane, an antenna plane angle between the antenna plane and the outer surface of the vehicle is in a range of 0 degrees to 90 degrees, and the radar sensing method comprises:

a steering matrix establishing step comprising establishing a steering matrix according to a plurality of first path group coefficients, a plurality of second path group coefficients, a plurality of third path group coefficients, a plurality of fourth path group coefficients and a plurality of steering vectors respectively corresponding thereto of the receiving antennas, and defining a receiving signal received by the receiving antennas as a function of the steering matrix, wherein for one of the receiving antennas, an actual target path is a straight-line path between the receiving antenna and an actual target, and a mirror target path is a straight-line path between the receiving antenna and a mirror target, which is virtual;

a sensing step comprising causing the receiving antennas to receive the receiving signal;

a normalizing step comprising normalizing the steering matrix with a component thereof corresponding to a reference antenna to obtain a normalized steering matrix, normalizing the receiving signal with a component thereof corresponding to the reference antenna to obtain a normalized receiving signal, and defining that the normalized steering matrix and the normalized receiving signal are equal, wherein the reference antenna is one of the receiving antennas; and a target angle table generating step comprising generating a target angle table according to the normalized steering matrix, wherein the target angle table comprises the steering matrix and an actual target angle corresponding thereto or a mirror target angle corresponding thereto, the actual target angle is an angle between a normal direction of the antenna plane and the actual target path, and the mirror target angle is an angle between the normal direction of the antenna plane and the mirror target path.

10. The radar sensing method of claim 9, further comprising:

an after-calibrating sensing step comprising calculating to obtain the steering matrix from the receiving signal corresponding thereto, and determining the actual target angle or the mirror target angle corresponding to the steering matrix according to the target angle table so as to reduce a sensing error resulted from the mirror target.

11. The radar sensing method of claim 9, further comprising:

an angle relationship obtaining step comprising obtaining an angle relationship according to a vertical distance between one of the receiving antennas and the outer surface of the vehicle, the antenna plane angle and the actual target path, wherein the angle relationship is a relationship between the actual target angle and the mirror target angle.

12. The radar sensing method of claim 11, wherein in the angle relationship obtaining step, a vertical distance between one of the receiving antennas and the outer surface of the vehicle is h, the antenna plane angle is $\theta_p$ degrees, the actual target path is s1, the actual target angle is $\theta_1$ degrees, the mirror target angle is $\theta_2$ degrees, and the following condition is satisfied:

$$\theta_2 = (90 - \theta_p) + \tan^{-1}\left(\frac{s1 \times \sin(90 - \theta_p - \theta_1) + 2 \times h}{s1 \times \cos(90 - \theta_p - \theta_1)}\right).$$

13. The radar sensing method of claim 9, further comprising:

a reflection coefficient obtaining step comprising obtaining a reflection coefficient of each of the receiving antennas according to the normalized steering matrix, wherein each of the reflection coefficients comprises an amplitude coefficient and a phase coefficient, and the reflection coefficient of each of the receiving antennas is an analytical solution;

wherein the target angle table generating step further comprises generating the target angle table further according to the reflection coefficients corresponding to the receiving antennas, respectively.

14. The radar sensing method of claim 13, wherein the reflection coefficient obtaining step further comprising defining each of the amplitude coefficient and the phase coefficient of the reflection coefficient of the reference antenna to be constant.

* * * * *